(12) United States Patent
Filson et al.

(10) Patent No.: US 8,948,824 B2
(45) Date of Patent: Feb. 3, 2015

(54) ELECTRONIC DEVICES WITH CLIPS

(75) Inventors: J. Benjamin Filson, San Jose, CA (US);
P. Jan Moolsintong, San Francisco, CA (US); S. Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 981 days.

(21) Appl. No.: 12/536,345

(22) Filed: Aug. 5, 2009

(65) Prior Publication Data
US 2011/0034219 A1 Feb. 10, 2011

(51) Int. Cl.
*H04M 1/00* (2006.01)
*H04M 1/02* (2006.01)

(52) U.S. Cl.
CPC ........ *H04M 1/0202* (2013.01); *H04M 2250/22* (2013.01)
USPC ........................................ 455/575.1; 224/667

(58) Field of Classification Search
USPC .......................... 455/575.1; 224/197, 666, 667
See application file for complete search history.

(56) References Cited

U.S. PATENT DOCUMENTS

| | | | |
|---|---|---|---|
| 5,799,652 A * | 9/1998 | Kotliar | 128/205.11 |
| 5,799,852 A * | 9/1998 | Vardanega | 224/667 |
| 7,151,664 B2 | 12/2006 | Hosey | |
| 7,166,791 B2 | 1/2007 | Robbin et al. | |
| 7,312,785 B2 | 12/2007 | Tsuk et al. | |
| 7,345,671 B2 | 3/2008 | Robbin et al. | |
| 7,348,967 B2 | 3/2008 | Zadesky et al. | |
| D578,139 S | 10/2008 | Sheba et al. | |
| 8,374,661 B2 * | 2/2013 | Fratti et al. | 455/575.6 |
| 2004/0155079 A1 * | 8/2004 | Shetler et al. | 224/197 |
| 2007/0241149 A1 | 10/2007 | Bhavnani | |
| 2009/0257207 A1 * | 10/2009 | Wang et al. | 361/752 |
| 2010/0087232 A1 * | 4/2010 | Yeh et al. | 455/575.4 |
| 2010/0144408 A1 * | 6/2010 | Chuang et al. | 455/575.4 |

OTHER PUBLICATIONS

Filson et al., U.S. Appl. No. 12/239,652, filed Sep. 26, 2008.

* cited by examiner

*Primary Examiner* — Myron K Wyche
(74) *Attorney, Agent, or Firm* — Brownstein Hyatt Farber Schreck, LLP

(57) ABSTRACT

A portable electronic device may have a clip. The clip may be mounted to a housing using hinge structures. The hinge structures may bias the clip towards a closed position. The clip may be opened to attach the portable electronic device to an object. When in the closed position, the clip may lie flush with the exterior of the device housing. Clip biasing may be provided using a torsion spring, a coil spring, a ribbon spring, a clip with built-in biasing, a tension spring, or a compression spring. A coupling mechanism may be used to attach the clip to the housing. The coupling mechanism may include a ratcheting rotatable mechanism, a fixed attachment structure, a flexible attachment structure, a removable structure, or a structure that includes a spring bias adjustment mechanism. The device may have a button with a touch sensor array.

24 Claims, 51 Drawing Sheets

ELECTRONIC DEVICES WITH CLIPS

BACKGROUND

This invention relates generally to electronic devices, and more particularly, to electronic devices with clips that allow the devices to be attached to items such as clothing.

Electronic devices such as cellular telephones and media players are increasingly popular. Because of their popularity, there is a desire to provide devices such these in a variety of form factors. For example, small media players are popular because of their light weight and compact size.

It is often desirable to use electronic devices such as these when engaging in active pursuits. Some devices are provided with lanyards, as this allows a device to be worn around a user's neck. Other devices are provided with belt pouches that allow a device to be carried on a user's belt or otherwise attached to a user's clothing.

While some conventional arrangements such as these may be helpful, they tend to be bulky, cumbersome, and unsightly.

It would therefore be desirable to be able to provide improved portable electronic devices such as portable electronic devices with clips for attaching the portable electronic devices to items of clothing.

SUMMARY

A portable electronic device such as a media player or cellular telephone may be provided with a clip. The clip may be biased towards a closed position. When opened, the clip can grasp an object such as an item of clothing.

A spring such as a tension spring, coil spring, ribbon spring, compression spring, or torsion spring may be used in biasing the clip towards the closed position. The clip may, if desired, be formed from a twisted loop-shaped member that imparts a bias to the clip.

Hinge structures for the clip may allow the clip to pivot about a pivot axis. The hinge structures may include a hinge pin that is aligned with the pivot axis. If desired, the hinge structures may include a linkage with more than one pivot point. For example, the hinge structures may include a hinge member that is attached to the housing at a first pivot point and that is attached to the clip at a second pivot point. A four-bar linkage may be used to attach the clip to the housing if desired.

The portable electronic device may include input-output components such as buttons and displays. If desired, the portable electronic device may include a button with a touch sensor array such as a capacitive touch sensor array. The button may be pressed to operate a dome switch. An actuator may place the button into a lockout mode when the user's touch is detected on an edge portion of the button.

The portable electronic device may have an audio jack into which an audio plug associated with an accessory such as a headset may be plugged. The portable electronic device may have a coupling mechanism with which the clip is coupled to the housing of the portable electronic device. The coupling mechanism may rotate about a rotational axis. The rotational axis may be perpendicular to the pivot axis of the. The rotating coupling mechanism may allow a user to place the portable electronic device in an optimal position during use (e.g., so that a headset cable that is protruding from the audio jack is located in a desired position). A ratchet structure may be incorporated into the rotating coupling mechanism to provide feedback to the user and to help hold the portable electronic device in its intended position.

The coupling mechanism that is used in coupling the clip to the housing of the portable electronic device may be formed from a removable mounting structure, a flexible mounting structure, a rotatable mounting structure (e.g., a ratchet-based structure), a fixed structure, or a structure in which spring bias for the clip can be adjusted.

The portable electronic device may be provided with a sliding switch. The sliding switch may have a switch member that protrudes through an opening in the device housing. The switch member may be biased towards the opening using flexible arms on a backing plate.

Further features of the invention, its nature and various advantages will be more apparent from the accompanying drawings and the following detailed description of the preferred embodiments.

DETAILED DESCRIPTION

Portable electronic devices are often carried in a user's pocket or bag. Other arrangements may also be used to help a user carry an electronic device. For example, a holster may be helpful for carrying a cellular telephone. A user might also use a lanyard for carrying a portable media player.

Sometimes it is desirable to attach portable electronic devices to a user's clothing. For example, a clip may be used to attach a media player to a user's exercise clothes when the user is exercising. A clip may also be helpful when a user is performing an activity that requires both hands or is in a situation in which use of the user's pocket or bag to stow the device is awkward or impossible.

Figure 1:
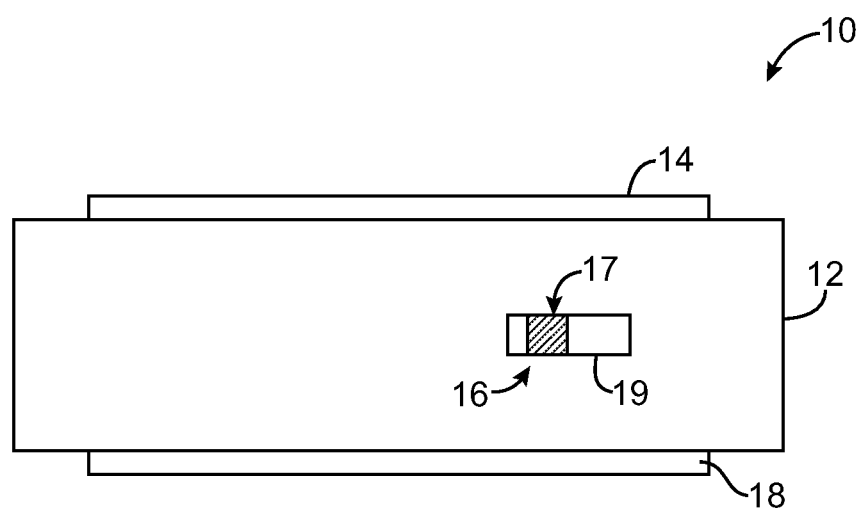
FIG. 1 is a side view of an illustrative electronic device with a clip in accordance with an embodiment of the present invention.

An illustrative electronic device that may be provided with a clip in accordance with embodiments of the present invention is shown in FIG. 1. Device 10 of FIG. 1 may be, for example, a portable electronic device such as a portable music player or a cellular telephone. Device 10 is typically compact. With one illustrative arrangement, device 10 has the size of a user's finger (e.g., device 10 has exterior dimensions that are generally less than about 3 inches, less than about 2 inches, or less than about 1 inch). Finger-size devices tend to be light in weight, so it is not unpleasant to clip a device of this type to an item of clothing. If desired, however, device 10 may be larger. The use of finger-size configurations for device 10 is merely illustrative.

If desired, device 10 may support wireless functions. For example, device 10 may support wireless functions such as local wireless link functions (e.g., for IEEE 802.11 operations or Bluetooth® operations). Device 10 may also support remote wireless links (e.g., for cellular telephone communications). To conserve battery life and reduce cost, device 10 may also be implemented in a configuration without wireless functions.

Device 10 may have housing 12. Housing 12 may be formed of any suitable materials including, plastic, glass, ceramics, metal, other suitable materials, or a combination of these materials.

Housing 12 may contain storage and processing circuitry for implementing device functions such as media playback functions and wireless communications functions.

Device 10 may have input-output devices such as button 14 and switch 16. Button 14 may be a stand-alone button or may be a button that is integrated with a display or touch sensor. A separate display or touch sensor may also be provided in device 10.

Device 10 may use any suitable display technology. For example, device 10 may include a liquid crystal display (LCD), an organic light emitting diode (OLED) display, or any other suitable display. The outermost surface of the displays in device 10 may be formed from one or more plastic or glass layers. If desired, touch screen functionality may be integrated into a display or may be provided using a separate touch pad device. An advantage of integrating a touch screen into displays in device 10 to make them touch sensitive is that this type of arrangement can save space and reduce visual clutter. If desired, touch functionality may be provided in a button such as button 14. For example, capacitive touch sensor electrodes may be included in all or part of button 14 so that the position of a user's finger can be determined. Button 14 may also be provided with an integral touch screen. To prevent inadvertent actuation of button 14 (e.g., when squeezing device 10 to actuate a clip), button 14 may be provided with a touch-triggered button lockout feature.

Switch 16 may be a sliding switch that has a switch member 17 that reciprocates along a switch opening 19 in housing 12. There may, in general, be any suitable numbers of buttons and switches on device 10. The configuration of FIG. 1 in which device 10 has a single button 14 and a single switch 16 is merely illustrative.

Input-output components such as buttons and switches may be used to control device functions such as power functions, media playback functions, cellular telephone functions, etc.

Device 10 may have a mechanism for attaching device 10 to a user's clothing or other objects. With one suitable arrangement, which is sometimes described herein as an example, device 10 may have one or more clips such as clip 18. Clip 18 may be placed in an open position or a closed position. Springs or other biasing structures may be used to bias the clip towards its closed position. In a typical scenario, a user presses on part of clip 18 to open the clip. When opened, an opening (sometimes called a throat) is created between clip 18 and housing 12. Clothing or other objects may be inserted into the opening. A user may then release the clip. When released, the biasing structure for the clip grasps the clothing between the clip and the housing. When the user has finished using the clip, the clothing can be released and the clip can be fully returned to its closed position.

Figure 2:
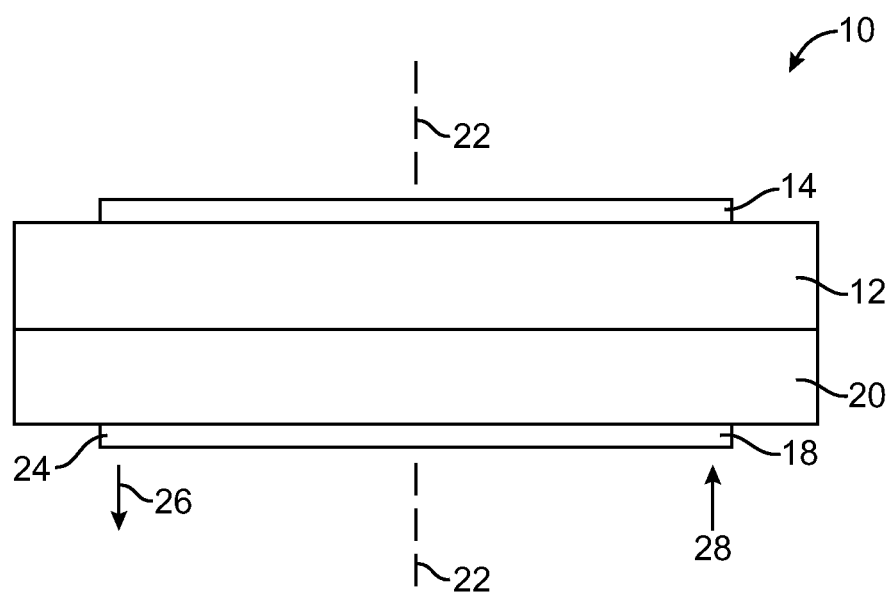
FIG. 2 is a side view of an illustrative electronic device with a clip and a coupling mechanism with which the clip is mounted to the housing of the electronic device in accordance with an embodiment of the present invention.

As shown in FIG. 2, clip 18 may be provided with a hinge or other mechanism in region 28 that allows clip end 24 to move away from housing 12 in direction 26.

Device 10 may also be provided with a clip coupling mechanism such as coupling mechanism 20. Coupling mechanism 20 may enhance the capabilities of clip 18. For example, coupling mechanism 20 may provide clip 18 with the ability to rotate about axis 22. Coupling mechanism 20 may also be used to help clip 18 to flex, to allow clip 18 to be removed and reattached to device 10, to adjust the biasing strength of the biasing structures for clip 18, etc. If desired, some or all of coupling mechanism 20 may be implemented using the structures of housing 12.

Figure 3:
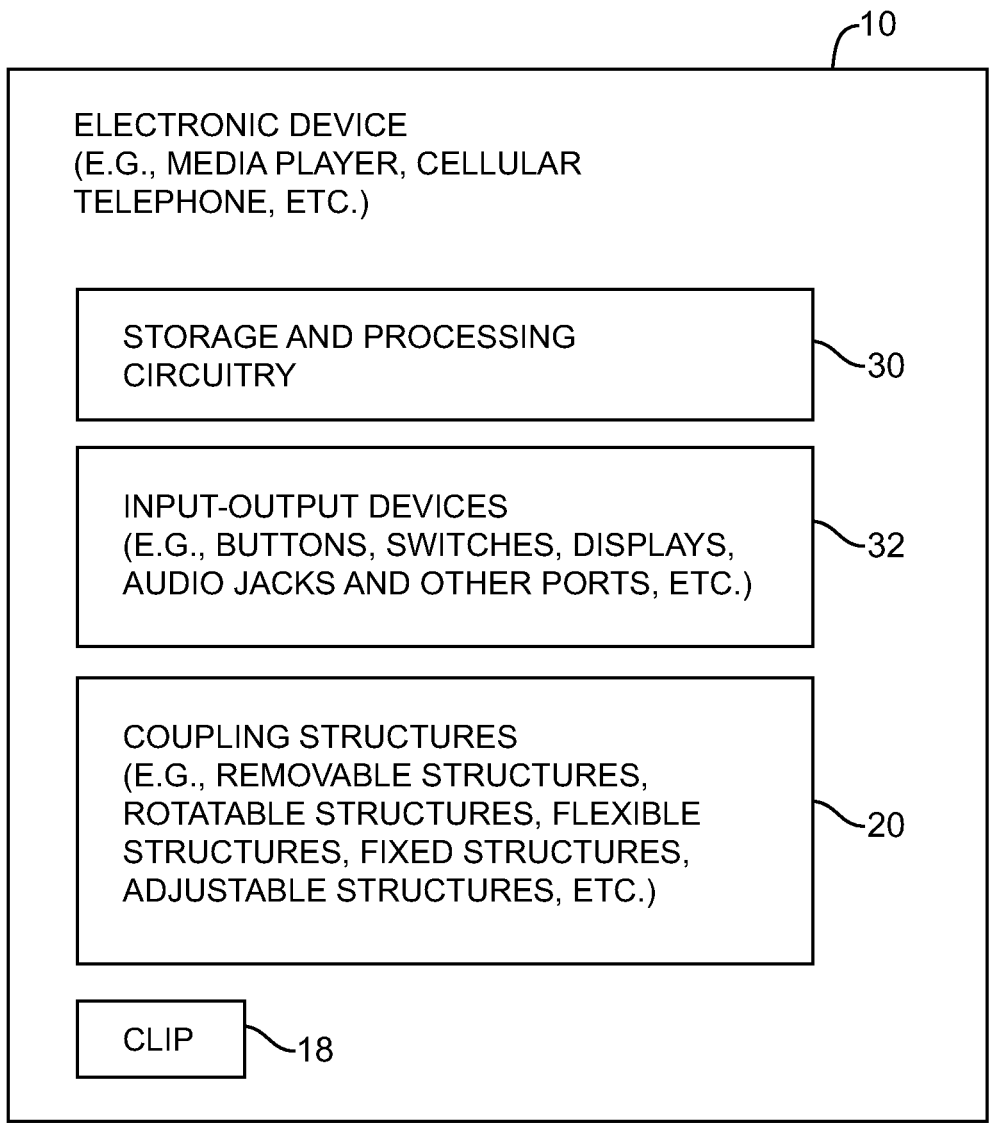
FIG. 3 is a schematic diagram of an illustrative electronic device that may be provided with a clip in accordance with the present invention.

A schematic diagram showing components that may be used in device 10 is shown in FIG. 3. As shown in FIG. 3, device 10 may include storage and processing circuitry 30. Storage and processing circuitry 30 may include storage devices such as volatile and nonvolatile memory chips, memory that is incorporated in other integrated circuits (e.g., registers, cache, or other memory in a processor or application-specific integrated circuit), hard disk drives, solid state disk drives, removable storage, etc. Storage and processing circuitry 30 may also include one or more processing circuits such as microprocessors, microcontrollers, digital signals processors, application specific integrated circuits, wireless communications processing circuits (e.g., baseband modules), audio and video processing circuits (e.g., a codec chip), etc.

Device 10 may also include input-output devices 32. Input-output devices 32 may include buttons, switches, or other electrical actuators, touch screens, non-touch displays, keyboards, key pads, audio jacks and other input-output connectors such as universal serial bus ports and other digital data ports, microphones, speakers, indicator lights, etc.

Coupling structures 20 may be used to couple clip 18 to housing 12, as shown in FIG. 2. Coupling structures 20 may include rotatable structures, removable structures, flexible structures, fixed structures, adjustable structures such as structures for adjusting clip bias, other suitable structures, or combinations of these coupling structures.

Figure 4:
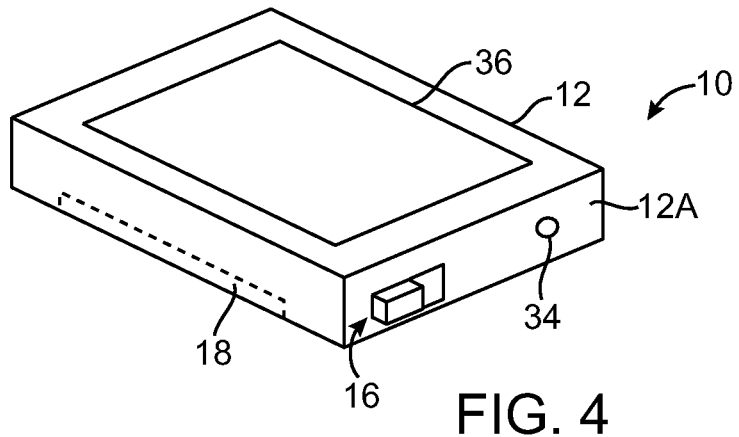
FIG. 4 is a perspective view of an illustrative electronic device with a rectangular housing that may be provided with a clip in accordance with an embodiment of the present invention.

Housing 12 may have any suitable shape. For example, housing 12 may have rectangular front and rear faces, as shown in FIG. 4. In the example of FIG. 4, input-output component 36 has been mounted on the front face (upper surface) of device 10. Component 36 may be a button, display, or any other suitable input-output device.

Device 10 may have an audio jack such as audio jack 34. Jack 34 may be, for example, a ⅛" (3.5 mm) audio jack that receives a mating plug on a headset or other audio accessory. In the example of FIG. 4, jack 34 has been formed on the same end face (housing end face 12A) of device 10 as switch 16. This is, however, merely illustrative. Audio jacks such as jack 34 may be provided on any suitable surface of housing 12 if desired.

As shown in FIG. 4, clip 18 may be mounted on the rear (lower) surface of device 10 (e.g., on the housing surface opposite to the housing surface that contains input-output component 36).

Figure 5:
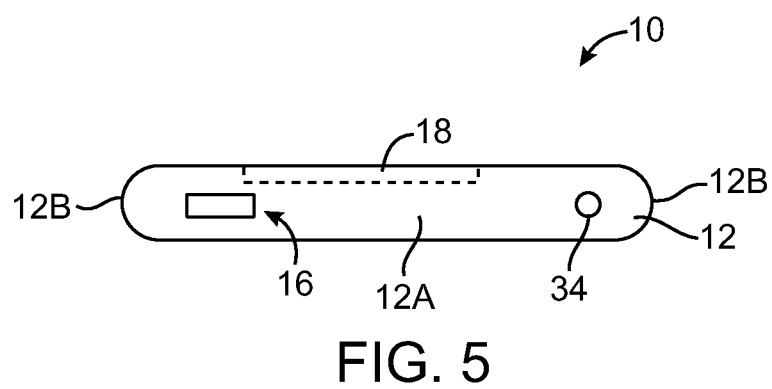
FIG. 5 is an end view of an illustrative electronic device with a rectangular housing with rounded edges that may be provided with a clip in accordance with an embodiment of the present invention.

In the example of FIG. 5, housing 12 has been provided with a planar end face (end face 12A) and rounded sidewalls (sidewalls 12B).

Figure 6:
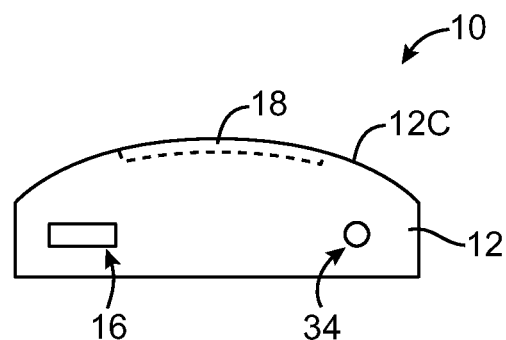
FIG. 6 is an end view of an illustrative electronic device with a housing having a curved housing wall with a clip in accordance with an embodiment of the present invention.

In the example of FIG. 6, surface 12C of housing 12 is curved. Clip 18 may have a curved shape that matches the shape of curved surface 12C and that allows clip 18 to be retracted in to a closed position in which clip 18 lies flush with housing 12.

Figure 7:
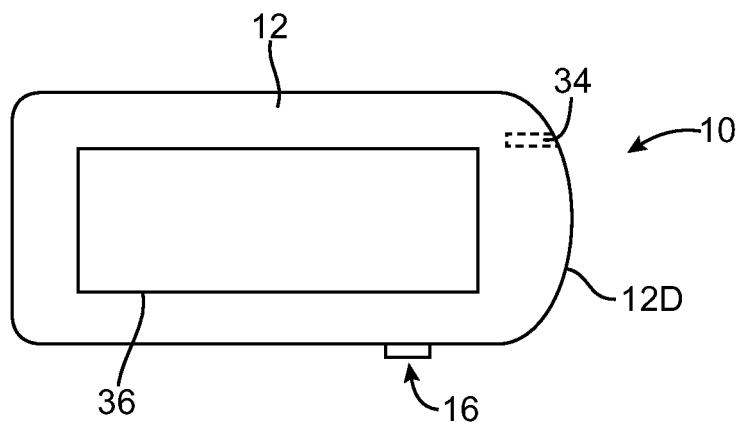
FIG. 7 is a top view of an illustrative electronic device with a rectangular housing having a curved end face in accordance with an embodiment of the present invention.

A top view of device 10 having a housing 12 with a curved end wall is shown in FIG. 7. As shown in FIG. 7, audio jack 34 may be mounted in curved end surface 12D of housing 12. Clip 18 may be mounted on the rear surface of device 10 (not shown in FIG. 7). Switch 16 of FIG. 7 may be mounted on one of the side walls of housing 12.

Figure 8:
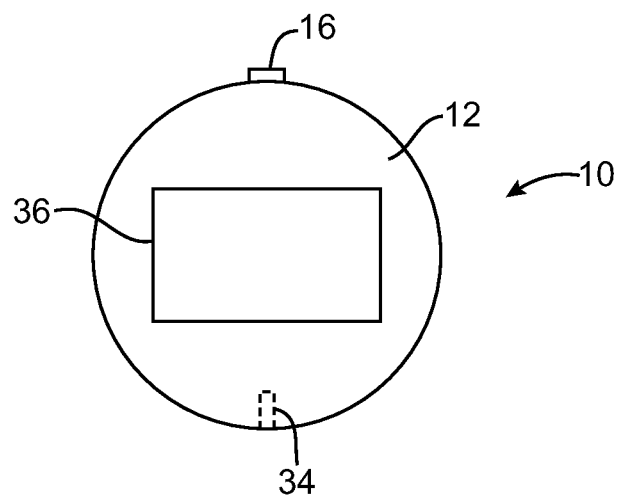
FIG. 8 is a top view of an illustrative electronic device with a circular housing outline that may be provided with a clip accordance with an embodiment of the present invention.

In the illustrative arrangement of FIG. 8, audio jack 34 and switch 16 are mounted on opposing sidewalls of housing 12. Housing 12 may have a circular shape of the type shown in the top view of FIG. 8 or may have other suitable shapes (e.g., oval shapes, shapes that include dome-shaped portions or spherical portions, triangular shapes, cylindrical shapes, etc.). The arrangement of FIGS. 4, 5, 6, 7, and 8 are merely illustrative.

Figure 9A:
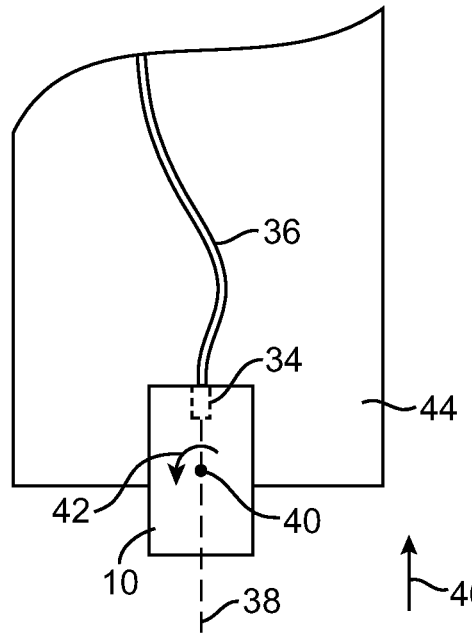
FIGS. 9A and 9B show how an illustrative electronic device with a rotatable clip may be placed in a variety of positions relative to an item such as a piece of clothing to which the electronic device is attached in accordance with an embodiment of the present invention.
Figure 9B:
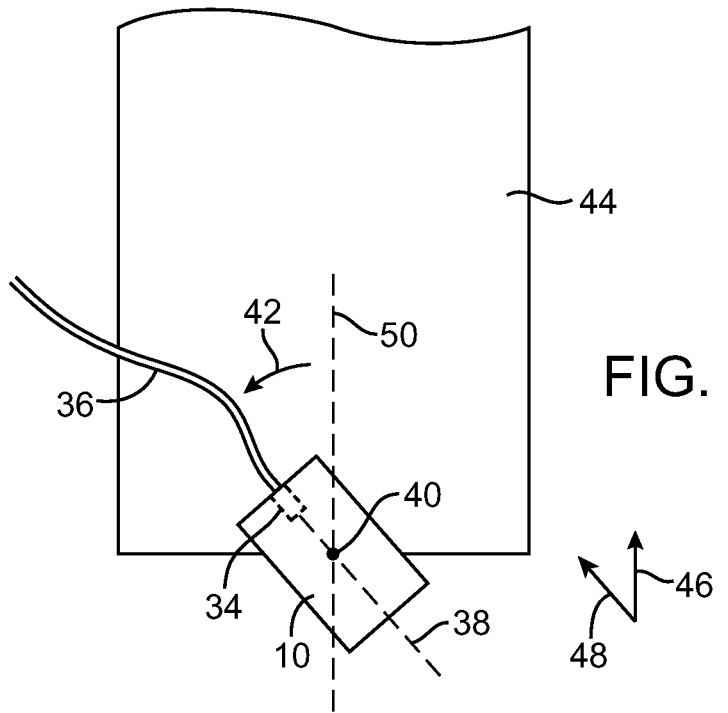

It may be desirable to rotate device 10 after device 10 has been attached to a users' clothing. This is illustrated in the example of FIGS. 9A and 9B. As shown in FIG. 9A, device 10 may be attached to a user's shirt sleeve or other clothing item 44 using a clip (e.g., clip 18 of FIG. 2). Coupling structure 20 (FIG. 2) may be a rotatable structure that couples clip 18 to housing 12 of device 10.

In the position shown in FIG. 9A, device 10 is oriented relative to its clip so that longitudinal axis 38 of audio jack 34 is oriented vertically along direction 46. This allows cable 36 of a headset or other accessory to protrude out of jack 34 in direction 46.

The orientation of device 10 of FIG. 9A may not be comfortable for the user. The user may therefore rotate device 10 about rotational axis 40 (an axis pointing out of the page in the orientation of FIG. 9A). The user may, for example, rotate device 10 relative to its clip in counterclockwise direction 42.

Following rotation, device 10 of FIG. 9A may appear as shown in FIG. 9B. As shown in FIG. 9B, device 10 may be oriented so that longitudinal axis 38 of audio jack 34 points in direction 48, rather than vertical direction 46. In this configuration, jack 34 is oriented so that longitudinal axis 38 is angled with respect to vertical axis 50. Clip coupling mechanism 20 may include a ratchet or other mechanism that helps to maintain device 10 in its rotated orientation following rotation. The user may therefore rotate device 10 whenever desired (e.g., to move cable 36 into a position that is most comfortable to the user).

Figure 10:
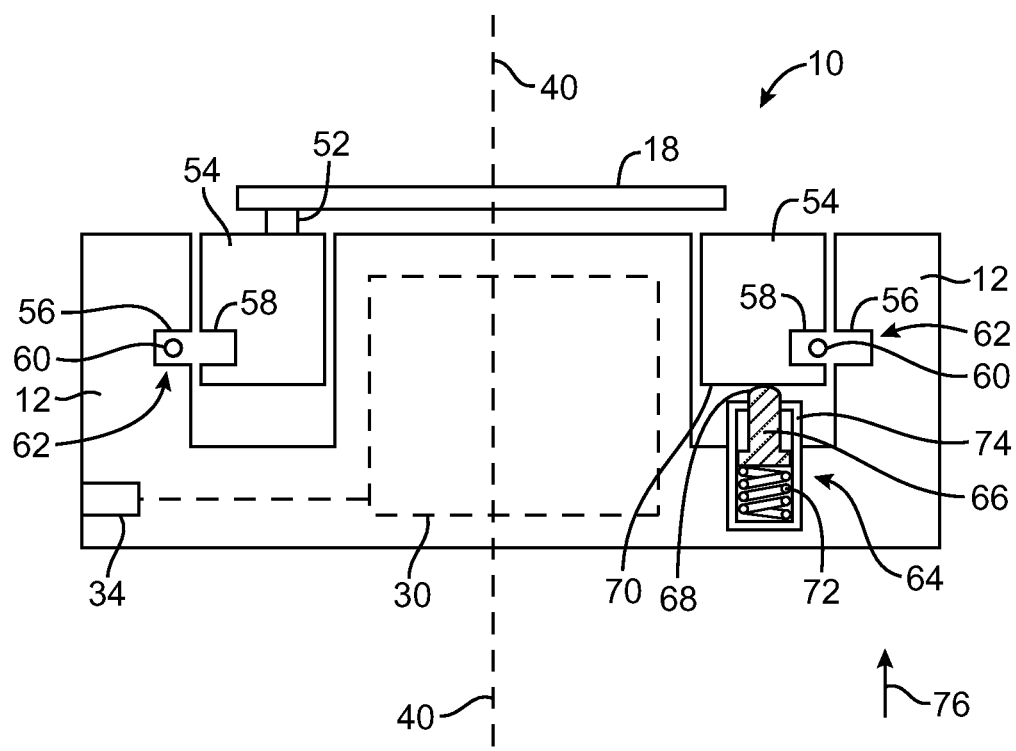
FIG. 10 is a cross-sectional side view of an electronic device with a ratcheting rotational coupling mechanism with which a clip may be mounted to the electronic device in accordance with an embodiment of the present invention.

An illustrative configuration for a device with a rotatable coupling mechanism is shown in FIG. 10. As shown in FIG. 10, device 10 may have storage and processing circuitry 30 that is mounted in housing 12. Storage and processing circuitry 30 may be electrically coupled to input-output devices such as audio jack 34. Audio jack 34 may protrude out of a sidewall of housing 12. Although the sidewalls of housing 12 are shown as being vertical in the cross-sectional view of the illustrative device in FIG. 10, this is merely an example. Jack 34 may protrude through an upper or lower face of housing 12 or the housing sidewalls may be curved (e.g., as shown in FIG. 5 by curved sidewalls 12B).

Device 10 of FIG. 10 may have upper and lower faces of any suitable shape. For example, the outline of device 10 may be circular as shown in the top view of device 10 in FIG. 8.

Rotatable ring member 54 may be mounted in housing 12. Clip 18 may be connected to ring member 54 by a structure such as hinge 52. When it is desired to rotate clip 18 relative to housing 12, clip 18 and rotatable ring member 54 may be rotated about rotational axis 40. Rotational axis 40 may be located in roughly the center of the upper and lower surfaces of housing 12 (as an example).

Housing 12 may have an annular groove such as groove 56. Rotatable ring member 54 may have a corresponding annular groove such as groove 58. When ring member 54 is placed within housing 12, grooves 56 and 58 may be aligned with each other to form annular groove 62. Annular spring 60 may have a star-shaped appearance (when viewed from the top). During assembly, spring 60 can be radially compressed before being released in grove 62. When released in groove 62, spring 60 expands and is captured by the walls of groove 62. The outer sidewalls of groove 62 resist further expansion of spring 60. When captured in groove 62, the meandering shape of spring 60 helps to hold rotatable ring member 54 in its desired position in housing 12 while allowing rotatable ring member 54 to freely rotate about rotational axis 40.

Device 10 may have a spring-loaded pin such as pin 64. Pin 64 may have a pin member 66 that reciprocates within pin barrel structure 74 along its longitudinal axis. Structure 74 may be provided by a pin barrel member, by portions of housing 12, or other suitable structures. A spring such as spring 72 may be provided in pin barrel structure 74 to bias pin member 66 upwards in direction 76. When biased upwards in direction 76 by spring 72, end 68 of pin member 66 bears against lower surface 70 of rotatable ring member 54. Surface 70 may be provided with corrugations that create detents in the rotational motion of rotatable ring member 54. These detents may give rise to audible clicks and tactile feedback when rotating member 54 and clip 18 relative to housing 12.

Figure 11A:
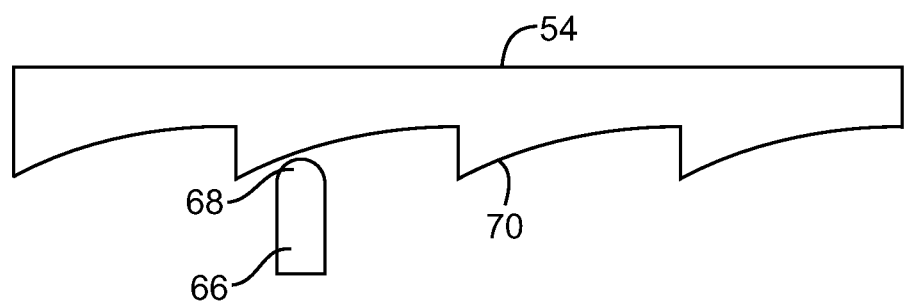
FIG. 11A is a cross-sectional side view of a portion of an illustrative one-way ratcheting mechanism that may be used in a rotational coupling structure of the type shown in FIG. 10 in accordance with an embodiment of the present invention.
Figure 11B:
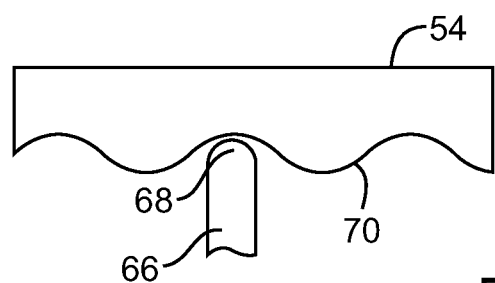
FIG. 11B is a cross-sectional side view of a portion of an illustrative two-way ratcheting mechanism that may be used in a rotational coupling structure of the type shown in FIG. 10 in accordance with an embodiment of the present invention.

Corrugated ring surface 70 may be configured to allow bidirectional rotation or unidirectional rotation. In the example of FIG. 11A, surface 70 has an asymmetric pattern that allows pin end 68 to ride over the surface peaks when ring member 54 is rotated in one direction (e.g., counterclockwise) but that prevents motion in the opposite direction (e.g., clockwise). In the example of FIG. 11B, surface 70 has a symmetric pattern of undulations that allows pin end 68 to ride over the peaks in surface 70 when ring member 52 is rotated in either a clockwise or a counterclockwise direction.

Figure 12:
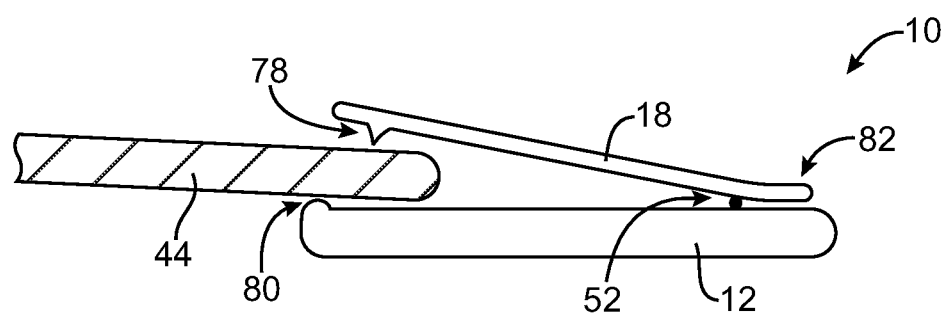
FIG. 12 is a side view of an illustrative electronic device with a clip that has been attached to an object such as an item of clothing in accordance with an embodiment of the present invention.

FIG. 12 is a side view of an illustrative device 10 in which clip 18 has been used to grasp an item of clothing 44. As shown in FIG. 12, clip 18 may be provided with one or more grip enhancement features such as protrusion 78. Housing 12 of device 10 may also be provided with one or more grip enhancement features such as protrusion 80. When clip 18 is being used to grasp clothing 44, protrusions 78 and 80 may help to prevent clothing 44 from slipping out of clip 18.

Clip 18 may pivot about hinge 52. Clip 18 may be opened by pressing on clip actuation structure 82. Any suitable configuration may be used for clip actuation structures in device 10. For example, clip actuation structure 82 may be smooth, may have depressions, may have protrusions, may have grooves, may have a rough surface, etc.

Figure 13:
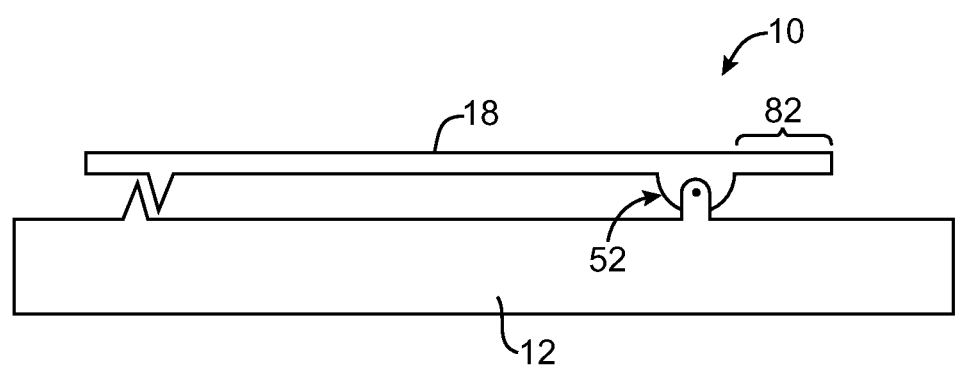
FIG. 13 is a side view of an illustrative electronic device having a clip with a flat actuation tab in accordance with an embodiment of the present invention.

FIG. 13 is a side view of an illustrative device configuration in which clip 18 has a flat and smooth clip actuation structure 82.

Figure 14:
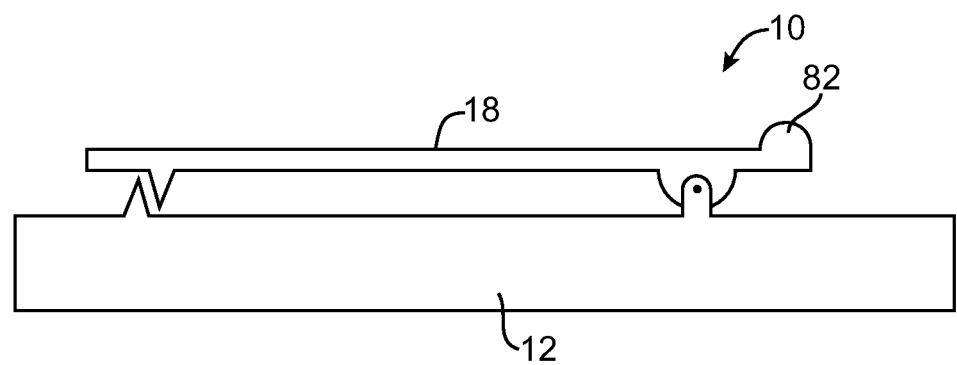
FIG. 14 is a side view of an illustrative electronic device having a clip with an actuation protrusion in accordance with an embodiment of the present invention.

FIG. 14 is a side view of an illustrative device configuration in which clip 18 has a clip actuation structure 82 with a protrusion. The use of a protrusion such as the protrusion of FIG. 14 may help a user actuate clip 18 with a finger without losing purchase on the clip actuation structure.

Figure 15:
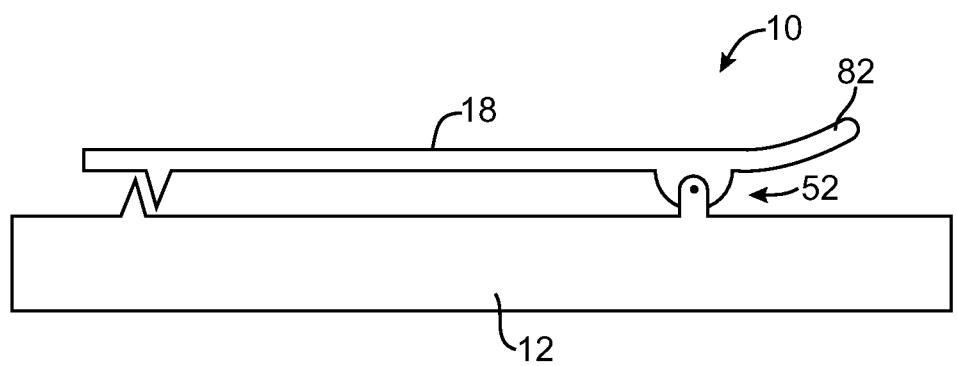
FIG. 15 is a side view of an illustrative electronic device having a clip with a flared finger actuation structure in accordance with an embodiment of the present invention.

As shown in FIG. 15, the end of clip 18 may be flared to provide a diving-board-shape to clip actuation structure 82. This type of arrangement may make it easier for a user to identify which end of clip 18 is the appropriate end to press when opening clip 18.

Figure 16:
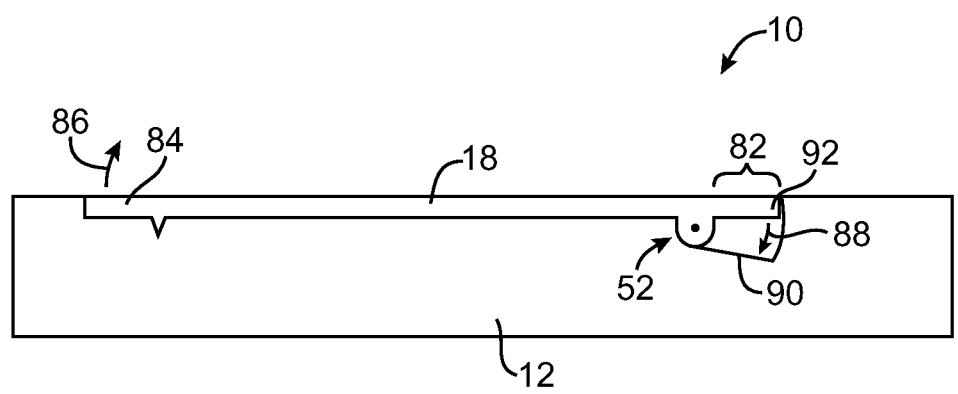
FIG. 16 is a cross-sectional side view of an illustrative electronic device with a clip that is flush with electronic device housing sidewalls in accordance with an embodiment of the present invention.

The examples of FIGS. 13, 14, and 15 involve the use of clips 18 that are mounted on a hinge 52 so that clip 18 is raised above the surface of housing 12 and is not flush. If desired, these clips and other clips may be mounted flush in housing 12. This type of arrangement is shown in FIG. 16. As shown in FIG. 16, the exterior surface of clip 18 may lie flush with one of the outer surfaces of housing 12, so that hinge 52 is recessed within housing 12. A cavity such as cavity 90 may be formed under clip actuation structure 82 of clip 18. When a user presses on clip actuation structure 82, end 92 of clip 18 will move inwardly in direction 88. As end 92 moves into cavity 90, end 84 of clip 18 will open outwardly in direction 86.

Figure 17:
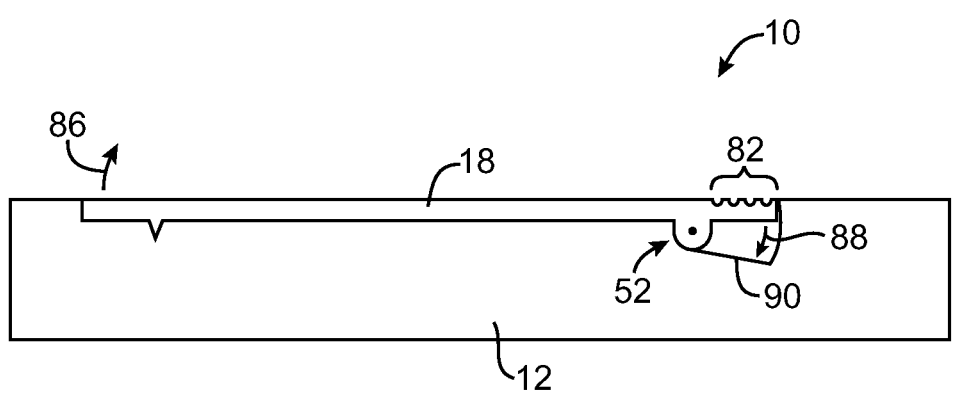
FIG. 17 is a cross-sectional side view of an illustrative electronic device with a clip that is flush with electronic device housing sidewalls and that has a grooved clip actuation structure in accordance with an embodiment of the present invention.
Figure 18:
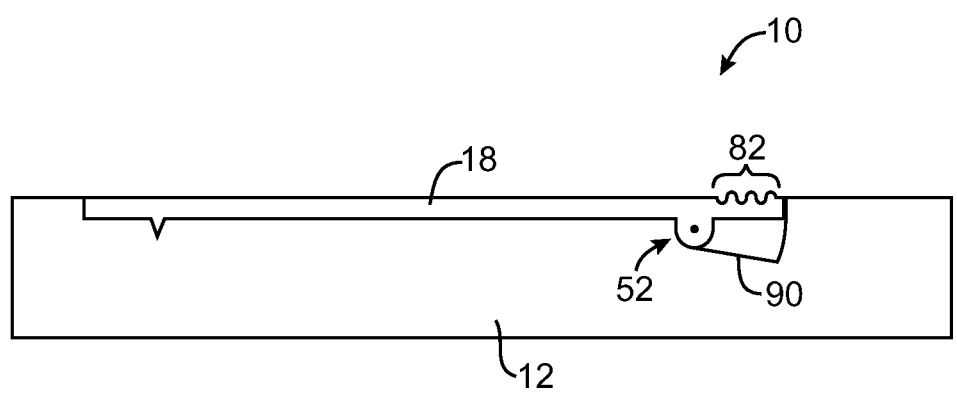
FIG. 18 is a cross-sectional side view of an illustrative electronic device with a clip that is flush with electronic device housing sidewalls and that has a grooved clip actuation structure with protruding ridges in accordance with an embodiment of the present invention.

As shown in FIG. 17, clip 18 may be provided with a clip actuation structure with grooves. The grooves of clip actuation structure 82 of FIG. 17 lie flush with the surface of housing 12. If desired, the grooves of clip actuation structure 82 may protrude above the surface of housing 12, as shown in FIG. 18.

Figure 19:
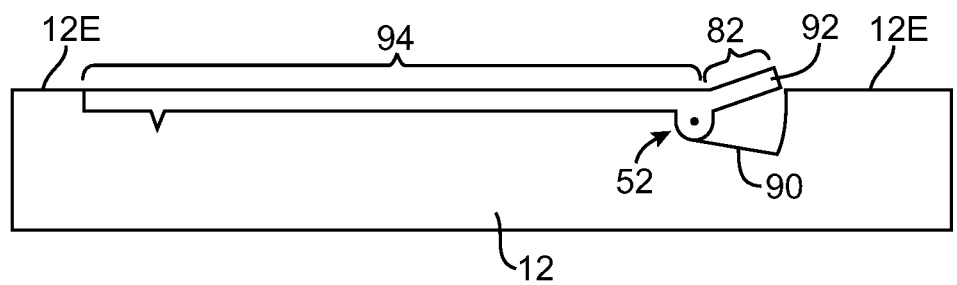
FIG. 19 is a cross-sectional side view of an illustrative electronic device with a clip that is flush with electronic device housing sidewalls and that has a flared clip end that serves as an actuation structure for the clip in accordance with an embodiment of the present invention.

FIG. 19 shows an illustrative arrangement for device 10 in which end 92 is bent outwards relative to main body 94 of clip 18. The bent shape of end 92 allows clip actuation structure 82 protrude above surface 12E of housing 12. Main body 94 of clip 18 may lie flush with housing surface 12E.

Figure 20:
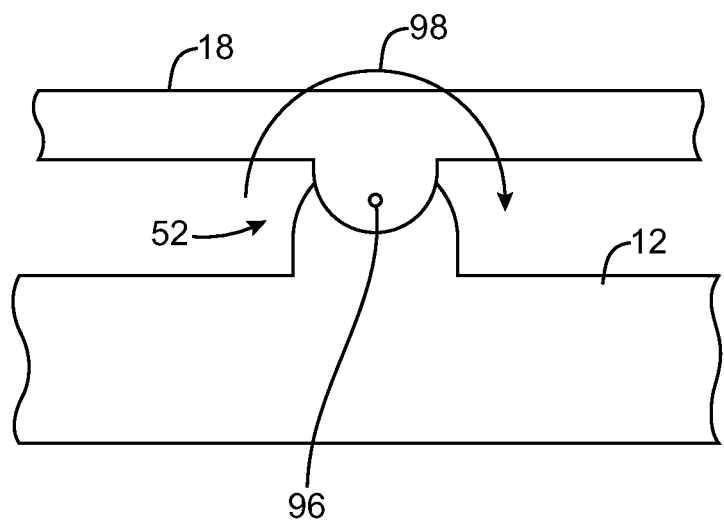
FIG. 20 is a cross-sectional side view of pivot structure that may be used to attach a clip to a housing of an electronic device in accordance with an embodiment of the present invention.

Hinge structures such as hinge 52 may have any suitable degree of freedom. An illustrative single-pivot configuration for hinge 52 is shown in FIG. 20. As shown in FIG. 20, hinge 52 may have a pin structure such as pin structure 96 formed from one or more pins. The pin structure may serve as a pivot point that allows clip 18 to pivot relative to device housing 12 (e.g., so that clip 18 can rotate about the pin in direction 98.

Figure 21:
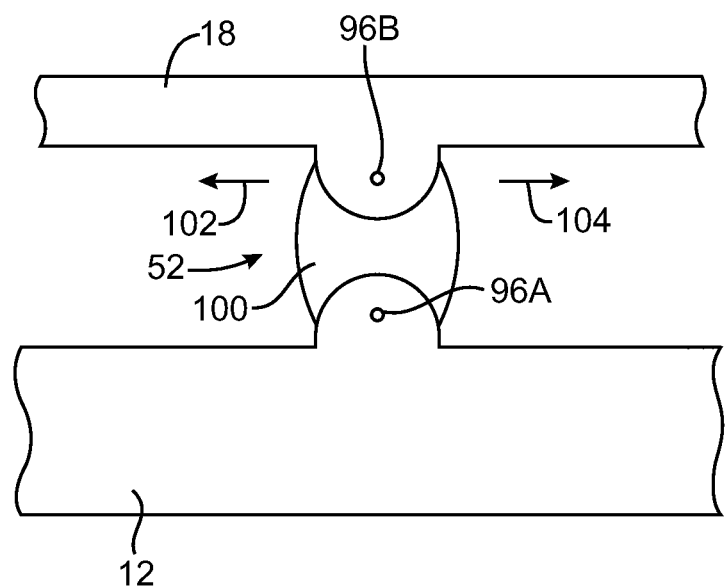
FIG. 21 is a cross-sectional side view of double-pivot structure that may be used as a linkage to attach a clip to a housing of an electronic device in accordance with an embodiment of the present invention.

If desired, hinge 52 may be provided with more degrees of freedom. An illustrative double-pivot configuration for hinge 52 is shown in FIG. 21. As shown in FIG. 21, a double-pivot design may use two pin structures such as pin structure 96A and pin structure 96B. A bar member such as member 100 may be used to connect clip 18 to housing 12. Because clip 18 can pivot relative to member 100 about pin structure 96A and because member 100 can pivot relative to housing 12 about pin structure 96B, a wide variety of motions of clip 18 may be permitted. For example, clip 18 may translate in direction 102 and in direction 104. This type of translational motion may be used, for example, to release and engage the tip of clip from a clip retention structure in housing 12.

Figure 22:
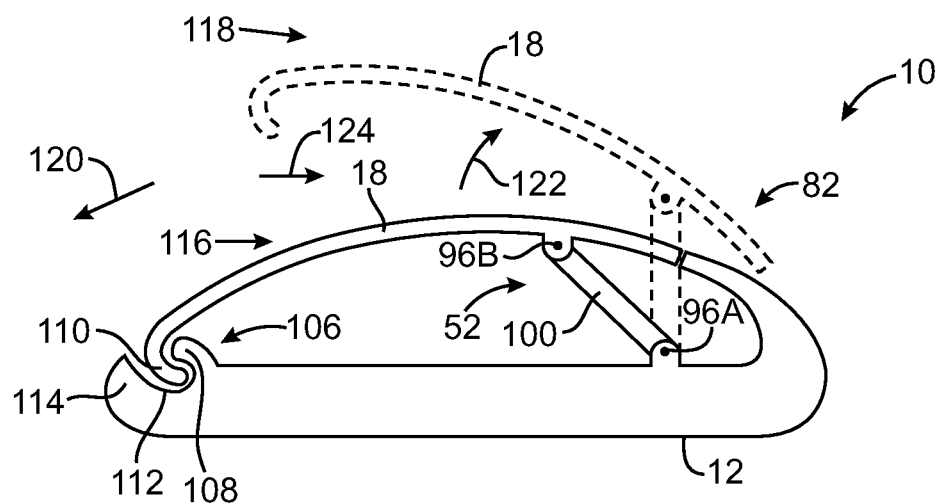
FIG. 22 is a cross-sectional side view of an illustrative electronic device that may have a double-pivot linkage of the type shown in FIG. 21 in accordance with an embodiment of the present invention.

An illustrative configuration for device 10 in which clip 18 is provided with a double-pivot hinge 52 to allow clip 18 to translate as described in connection with FIG. 21 is shown in FIG. 22. As shown in FIG. 22, clip 18 may be provided with a curved tip 110 that serves as a clip engagement structure. When clip 18 is in its closed position, clip engagement structure 110 may be received within mating recess 112 of housing 12. Recess 112 may be formed from housing portions such as protrusion 108 and tip 114 or other suitable device structures.

Hinge 52 has pins 96A and 96B. Pins 96A and 96B are connected by hinge member 100. This allows clip 18 to be translated substantially parallel to the surface of device 10. For example, when it is desired to release clip from stowed position 116, clip 18 may be moved in direction 120. Once tip 110 disengages from recess 112, clip 18 can be moved in direction 122 to reach open position 118. After clip 18 has been used, clip 18 can be returned to stowed position 116 by moving clip 18 in direction 120 until tip 110 is engaged by recess 112. Clip 18 can then be released. Springs or other suitable biasing mechanisms may be used to provide biases to close clip 18 and to help hold clip 18 in place in stowed position 116.

Figure 23A:
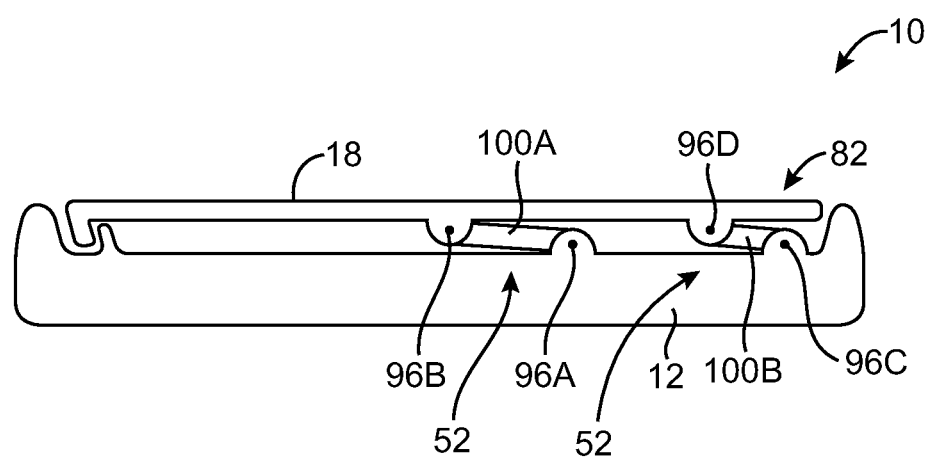
FIG. 23A is a cross-sectional side view of an electronic device having a clip that is attached to the electronic device using a four-bar linkage in accordance with an embodiment of the present invention.
Figure 23B:
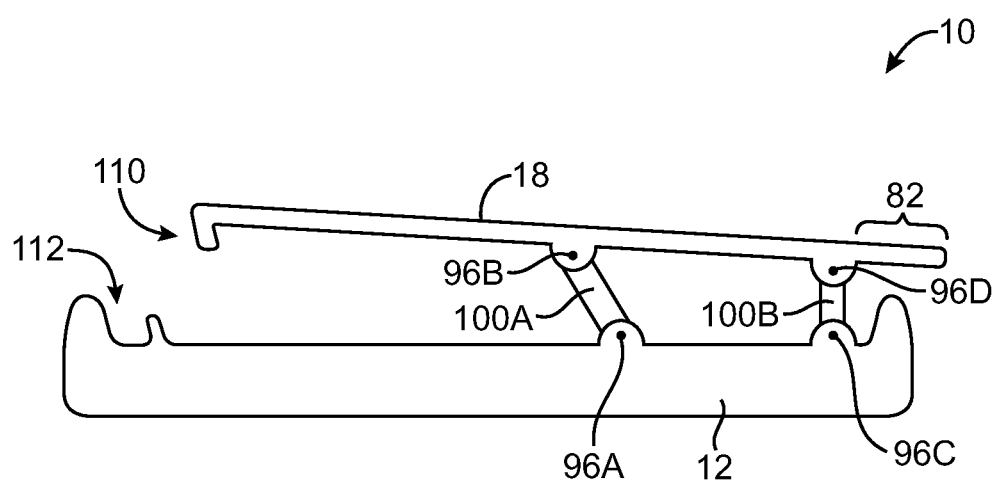
FIG. 23B is a cross-sectional side view of an electronic device of the type shown in FIG. 23A with the clip in the open position in accordance with an embodiment of the present invention.

As shown in FIG. 23A, hinge structure 52 may be implemented using a four-bar linkage. With this type of arrangement, bar 100A is used to connect hinge pin 96A with hinge pin 96B and bar 100B is used to connect hinge pin 96C with hinge pin 96D. Housing 12, clip 18, member 100A, and member 100B serve as four "bars" in the four-bar linkage of FIG. 23A. As shown in FIG. 23B, this type of linkage may allow a satisfactorily wide throat to be produced when clip 18 is opened while preventing clip 18 from over-opening.

Figure 24A:
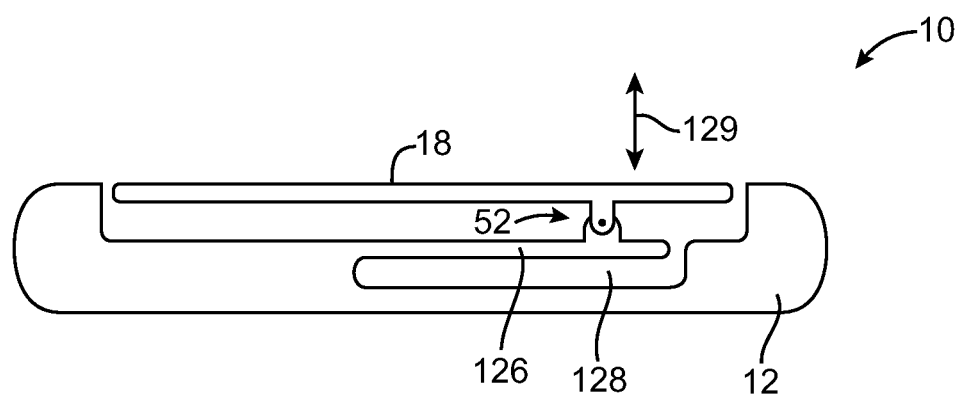
FIG. 24A is a cross-sectional side view of an illustrative electronic device with a clip that is attached to the electronic device using a flexible mounting member in accordance with an embodiment of the present invention.
Figure 24B:
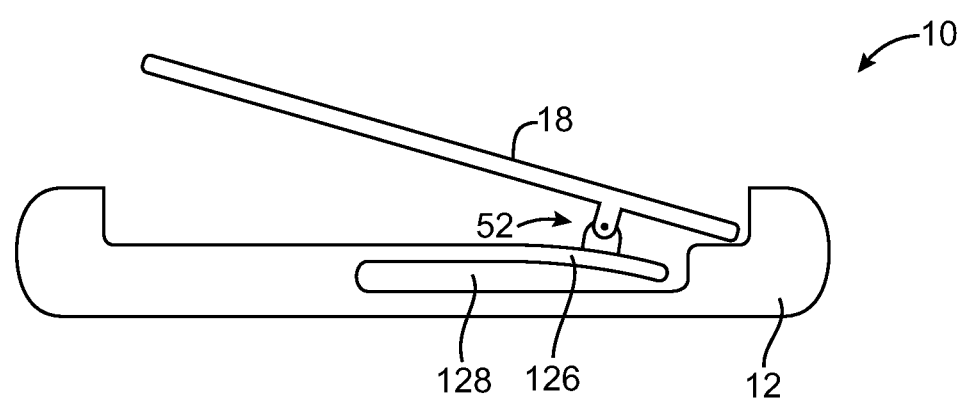
FIG. 24B is a cross-sectional side view of the illustrative electronic device of FIG. 24A with the clip in an open position and its flexible mounting member in a bent position in accordance with an embodiment of the present invention.

If desired, clip 18 may be coupled to device 10 using a flexible mounting arrangement. As shown in FIG. 24A, for example, clip 18 and hinge 52 may be mounted on a flexible member such as flexible member 126. Flexible member 126 may be formed from a portion of housing 12 or a separate structure that is attached to housing 12. Member 126 may be formed from a thin sheet of metal or other suitable flexible material that allows member 126 to flex up and down (directions 129). A cavity such as cavity 128 may be formed in housing 12 to allow member 126 to flex towards the interior of device 10. When a user presses on clip 18, member 126 may flex inwards as shown in FIG. 24B. This may allow clip 18 to open more widely than would otherwise be possible.

Figure 25:
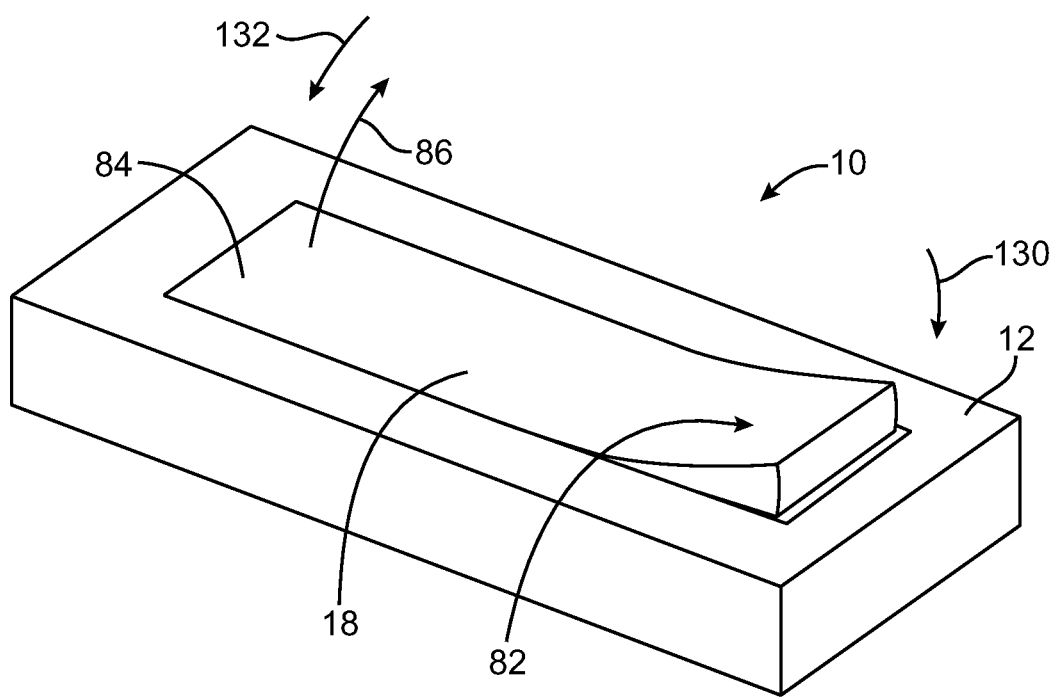
FIG. 25 is a perspective view of an illustrative electronic device having a clip that is flush with the housing of the electronic device and that has a flared actuation portion in accordance with an embodiment of the present invention.

A perspective view of an illustrative device 10 with a clip that lies flush with the device housing is shown in FIG. 25. As shown in FIG. 25, when a user presses inwardly on clip actuation structure 82 in direction 130, clip 18 pivots about an internal hinge in housing 12 so that end 84 of clip 18 move outwardly in direction 86. When a user releases clip 18, a clip biasing structure may bias end 84 inwardly in direction 132 (e.g., to grasp an item of clothing).

The clip biasing structure for clip 18 may be based on magnets, flexing clip structures, springs, or any other suitable biasing arrangement.

Figure 26:
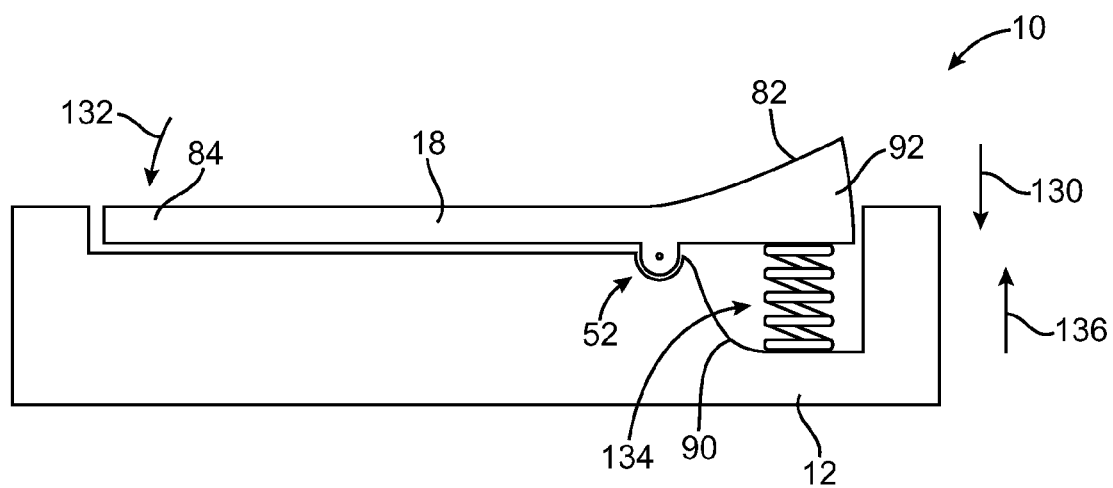
FIG. 26 is a cross-sectional side view of an illustrative electronic device of the type shown in FIG. 25 showing how the clip may be biased using a compression spring in accordance with an embodiment of the present invention.

An example of a clip biasing structure based on a compression spring is shown in FIG. 26. As shown in FIG. 26, spring 134 may be mounted in the interior of device 10 in cavity 90. When a user presses on clip actuation structure 82, end 92 of clip 18 will be forced inwardly in direction 130, thereby compressing spring 134. When clip 18 is released, compression spring 134 will expand in direction 136, pressing against end 92. This will cause clip 18 to pivot about hinge 52 so that end 84 of clip 18 is biased in direction 132, thereby closing clip 18.

Figure 27:
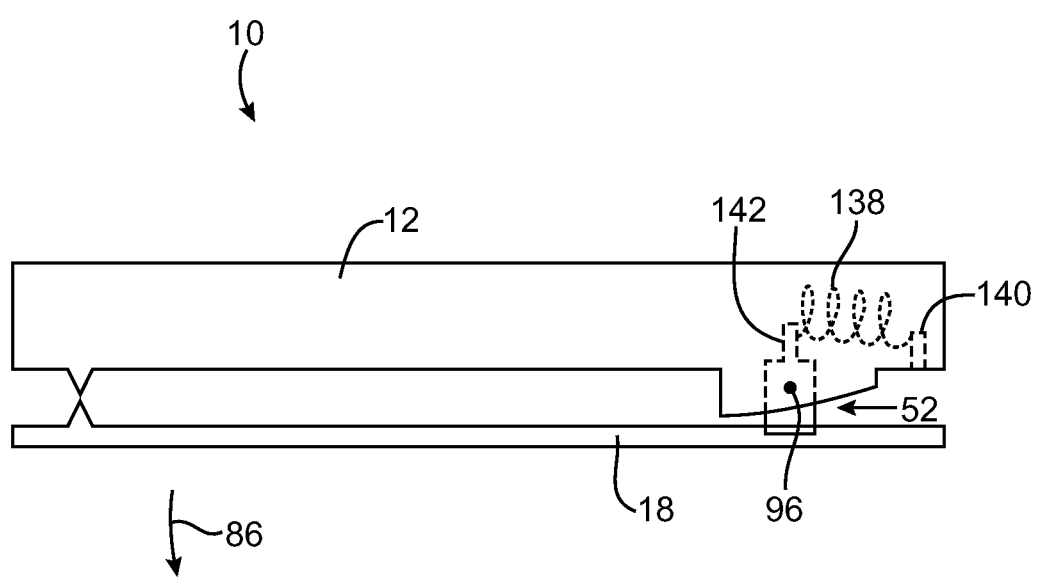
FIG. 27 is a cross-sectional side view of an illustrative electronic device showing how a clip may be biased using a tension spring in accordance with an embodiment of the present invention.

Another illustrative biasing arrangement for clip 18 is shown in FIG. 27. As shown in FIG. 27, tension spring 138 may be connected between housing structure 140 and clip structure 142. When clip 18 is opened in direction 86, structure 142 will rotate about hinge pin structure 96, so that spring holding structure 142 on clip 18 will move away from spring holding structure 140 in housing 12. This stretches and tensions spring 138, thereby pulling post 142 back into device 10 and biasing clip 18 towards its closed position.

If desired, biasing functions can be incorporated into clip 18 by forming clip 18 from a flexible structure that serves as a type of integral biasing structure. An illustrative arrangement of this type is shown in the example of FIGS. 28, 29, 30A, and 30B.

Figure 28:
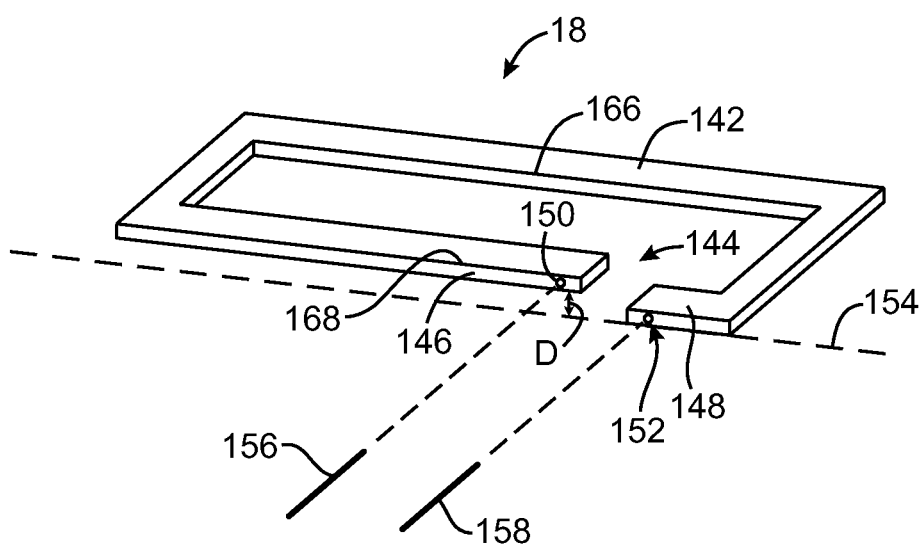
FIG. 28 is a perspective view of an illustrative electronic device clip that is formed from a twisted loop of material that can serve as an integral spring and clip structure in accordance with an embodiment of the present invention.

As shown in FIG. 28, clip 18 may be formed from a member such as open loop member 142. Open loop member 142 may be formed from a ring of metal or other suitable material with a gap 144 that separates end 146 from end 148. In its unassembled state, loop member 142 may be twisted as shown in FIG. 28, so as to provide a built-in bias when assembled in device 10. When twisted, end 148 will lie on line 154, but end 146 will lie at a distance D above line 154. Cylindrical bores 150 and 152 may serve as pin holes into which hinge pins 156 and 158 may be inserted.

Figure 29:
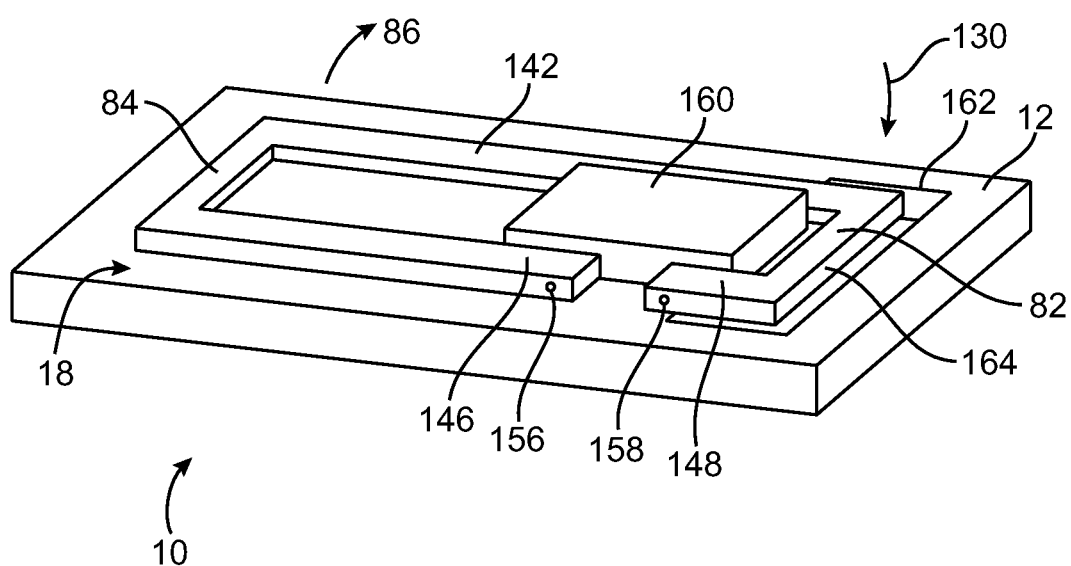
FIG. 29 is a rear perspective view of an illustrative electronic device with a clip of the type shown in FIG. 28 in accordance with an embodiment of the present invention.

As shown in FIG. 29, housing 12 of device 10 may have a hinge support structure 160 that receives pins 156 and 158. When clip 18 is attached to device 10, pins 156 and pins 158 pass through pin holes 150 and 152 (FIG. 28) and are received by corresponding holes in hinge support structure 160. This forces end 146 of loop member 142 downward and into alignment with end 148, thereby biasing loop 142 so that end 84 presses inwardly against housing 12.

When a user presses on clip actuation structure 82, end 164 of loop member 142 is forced into housing cavity 162. This causes end 84 of clip 18 to move in direction 86, thereby opening clip 18.

Figure 30A:
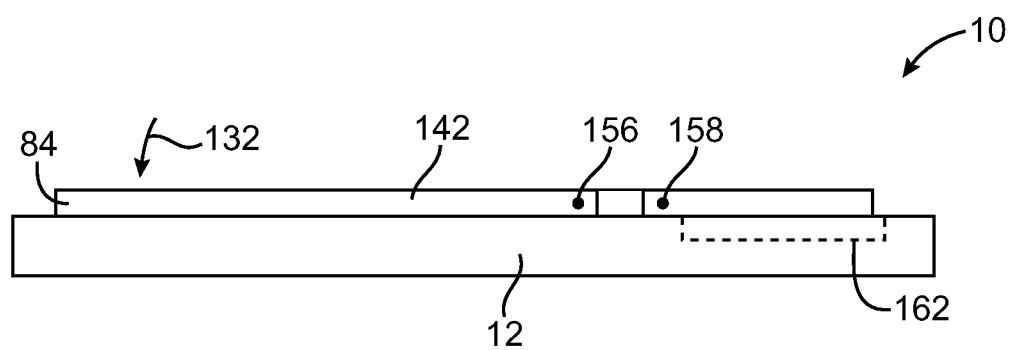
FIG. 30A is a side view of an illustrative electronic device of the type shown in FIG. 29 with its clip in a closed position in accordance with an embodiment of the present invention.
Figure 30B:
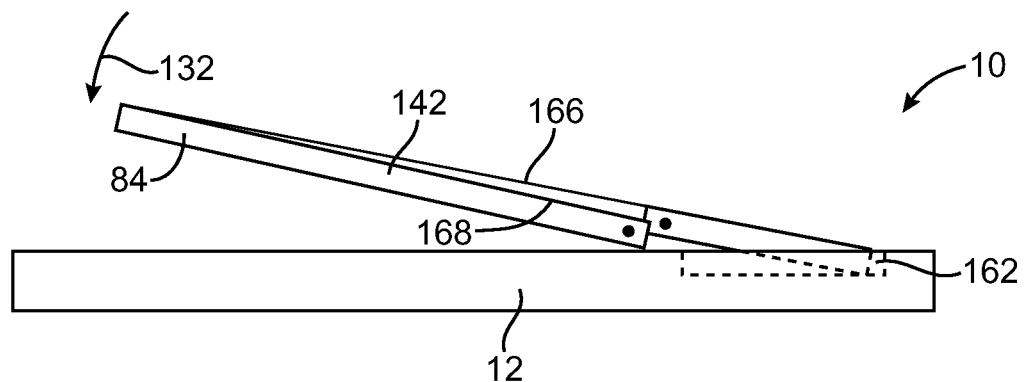
FIG. 30B is a side view of an illustrative electronic device of the type shown in FIG. 29 with its clip in an open position in accordance with an embodiment of the present invention.

A side view of clip 18 of FIG. 29 in its closed position is shown in FIG. 30A. In this configuration, end 84 is biased inwardly in direction 132 as loop member 142 attempts to regain its original shape. This original shape is shown in FIG. 28. FIG. 28 also shows the location of loop member edges 166 and 168. As shown in FIG. 30B, when a user opens clip 18, edge 166 of loop member 142 rises above edge 168 of loop member 144. This generates a restoring bias for end 84 of clip 18 in direction 132.

Figure 31:
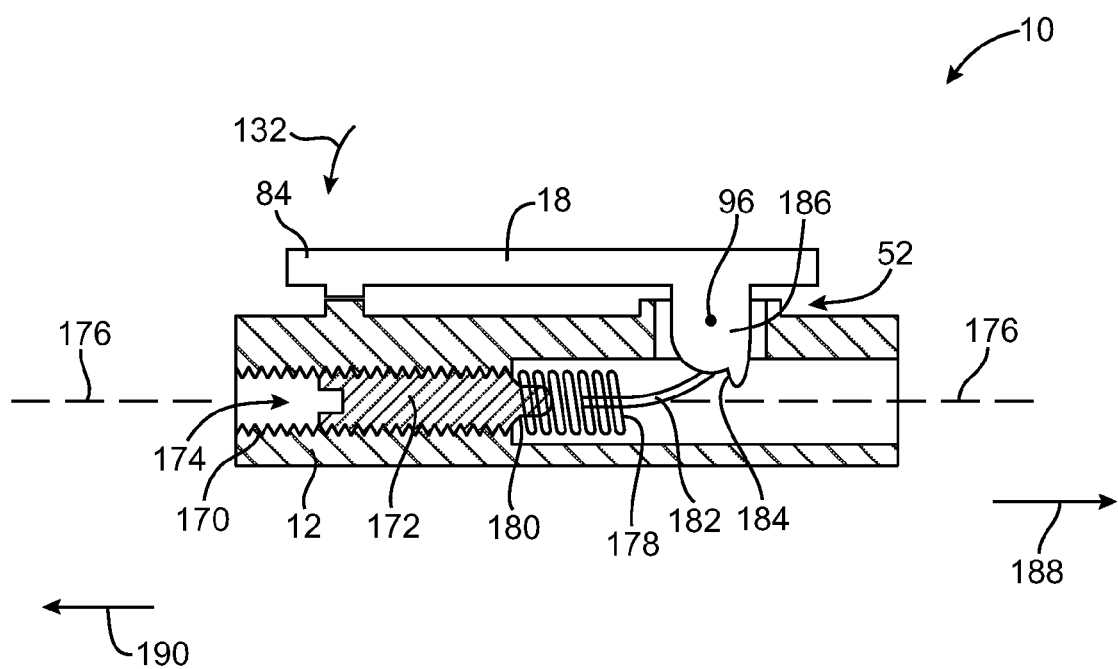
FIG. 31 is a cross-sectional side view of an illustrative electronic device clip with an adjustable compression spring in accordance with an embodiment of the present invention.

FIG. 31 shows an illustrative configuration for clip 18 in which the magnitude of the clip closing bias may be adjusted by a user (e.g., during manufacturing, by service personnel, or by an end user).

As shown in FIG. 31, housing 12 may have a threaded bore such as bore 170 that receives a corresponding threaded screw such as screw 172. Screw 172 may have a slot such as slot 174 or other tool engagement structure that receives a screwdriver blade or other tool structure. When a user rotates the screwdriver about rotational axis 176, screw 172 will advance into bore 170 in direction 188. Spring 178 may be compressed between end 180 of screw 172 and linking structure 182. This presses linking structure 182 against portion 184 of hinge member 186 and causes clip 18 to rotate about pin 96 in hinge 52 so that end 84 of clip 18 is biased inwardly in direction 132. If screw 172 is rotated so that screw 172 advances significantly into bore 170 in direction 188, spring 178 will be compressed more forcefully and clip 18 will be biased towards its closed position more forcefully. If screw 172 is rotated so that screw 172 is retracted out of bore 170 in direction 190, spring 178 will be compressed less forcefully and the inward biasing force on clip 18 will be reduced accordingly.

Figure 32:
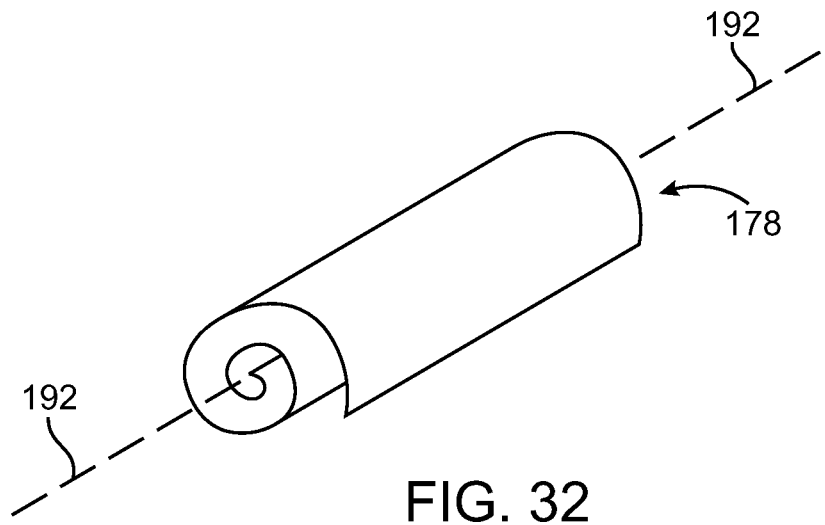
FIG. 32 is a perspective view of an illustrative ribbon spring that may be used in biasing a clip in an electronic device in accordance with an embodiment of the present invention.
Figure 33:
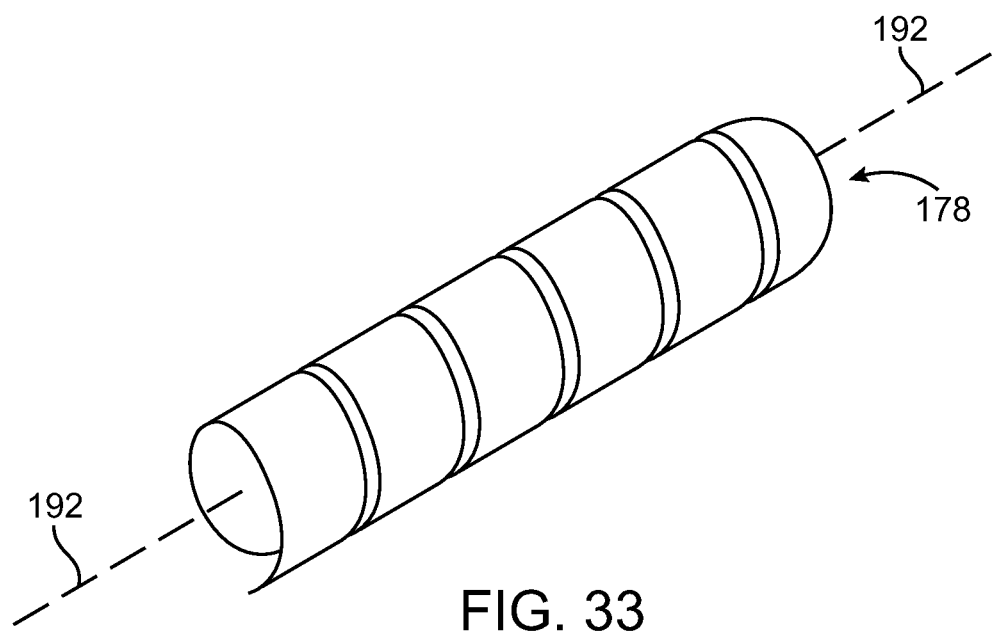
FIG. 33 is a perspective view of an illustrative coil spring formed from a flat strip of metal that may be used in biasing a clip in an electronic device in accordance with an embodiment of the present invention.

In the example of FIG. 31, spring 178 is a coil spring that is used in a compression spring configuration. This is merely illustrative. Any suitable biasing spring may be used to provide closing bias for clip 18 if desired. As shown in FIG. 32, for example, spring 178 may be implemented using a ribbon spring configuration. FIG. 33 shows an example in which spring 178 is a coil-type spring formed from a flat strip of metal. Springs such as springs 178 of FIGS. 32 and 33 may be tightened and loosened by twisting them about hinge pivot axis 192.

Figure 34:
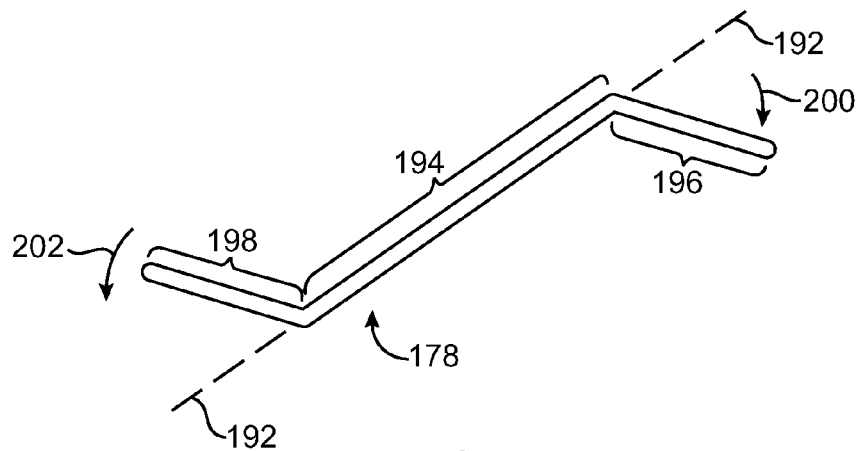
FIG. 34 is a perspective view of an illustrative single-ended torsion spring formed from a piece of bent wire for biasing a clip in an electronic device in accordance with an embodiment of the present invention.

If desired, spring 178 may be formed using a torsion spring configuration. An illustrative single-ended torsion spring is shown in FIG. 34. As shown in FIG. 34, torsion spring 178 may have a main elongated portion 194 that is generally aligned with hinge rotational axis 192. Spring 178 may have ends 196 and 198 that are bent at angles with respect to axis 192. When tensioned, spring 178 may produce a biasing force so that end 196 presses in direction 200 and end 198 presses in direction 202. This biasing force may be used to close clip 18.

Figure 35:
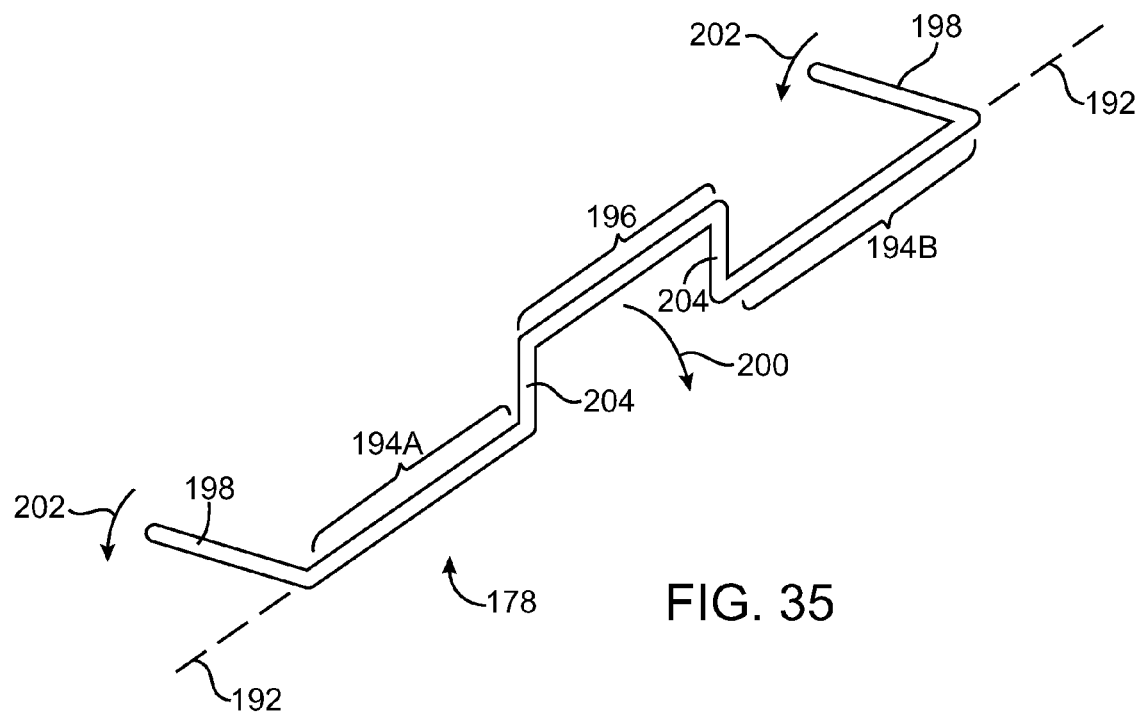
FIG. 35 is a perspective view of an illustrative double-ended torsion spring for biasing a clip in an electronic device in accordance with an embodiment of the present invention.

A double-ended torsion spring is shown in FIG. 35. In the arrangement of FIG. 35, spring 178 has elongated portions 194A and 194B that are generally aligned with hinge rotational axis 192. Ends 198 may be bent at an angle with respect to axis 192 (e.g., at a right angle). Portions 204 may also be formed at an angle with respect to portions 194A and 194B and may be used to couple central portion 196 to portions 194A and 194B. Springs having the configuration of spring 178 of FIG. 35 are sometimes referred to as double-ended torsion springs, because both of their ends 198 are biased in the same direction. In the example of FIG. 35, spring 178 may produce a biasing force so that central portion 196 presses in direction 200 while ends 198 each press in direction 202. As with single-ended torsion spring 178 of FIG. 34, the biasing force produced by double-ended torsion spring 178 of FIG. 35 may be used to close clip 18.

Figure 36:
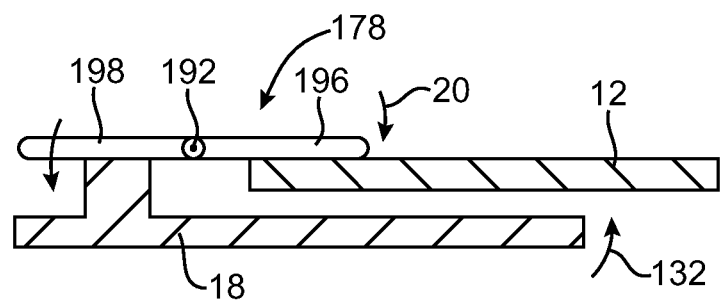
FIG. 36 is a side view of an illustrative torsion spring showing how the spring may bias a clip relative to the housing of an electronic device in accordance with an embodiment of the present invention.

The cross-sectional view of FIG. 36 shows how the ends of a torsion spring such as ends 196 and 198 of single-ended torsion spring 178 of FIG. 34 may bias clip 18 relative to device housing 12. When clip 18 is moved from its closed position to its open position, spring 178 is twisted (torsioned). This twisting motion stores energy in spring 178 and gives rise to a condition in which spring 178 desires to twist in an opposing direction to release its stored energy. As shown in FIG. 36, when torsion spring 178 is released, spring 178 causes arm 196 to twist about hinge rotational axis 192 in direction 200 against housing 12 while causing end 198 to twist about hinge rotational axis 192 in direction 198 against spring 18. This biases spring 18 in direction 132 towards its closed position against housing 12.

Figure 37:
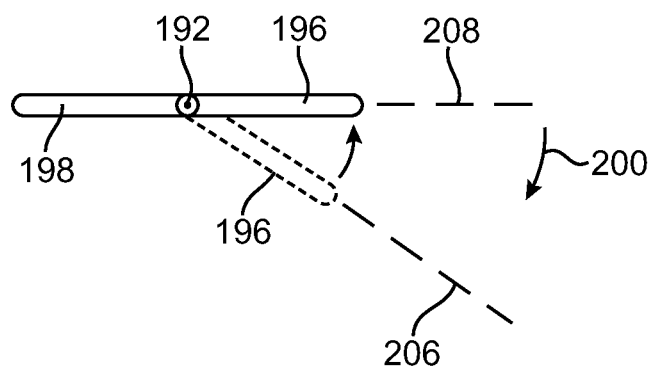
FIG. 37 is a side view of a torsion spring showing how the spring may be pre-biased to help hold a clip in a closed position against the wall of an electronic device housing in accordance with an embodiment of the present invention.

If desired, a torsion spring such as single-ended torsion spring 178 of FIG. 34 or double-ended torsion spring 178 of FIG. 35 may be pre-biased. As shown in FIG. 37, for example, spring 178 may initially be manufactured so that in its resting state (when storing no energy) arm 196 is oriented along axis 206. During pre-biasing operations (e.g., as part of the process of assembling device 10), spring 178 may be twisted so that arm 196 is moved into alignment with axis 208. In this configuration, spring 178 will bias arm 196 in direction 200. This biasing force exists even without opening clip 18 and may therefore be used to maintain clip 18 in its desired closed position against housing 12 when not in use.

Figure 38:
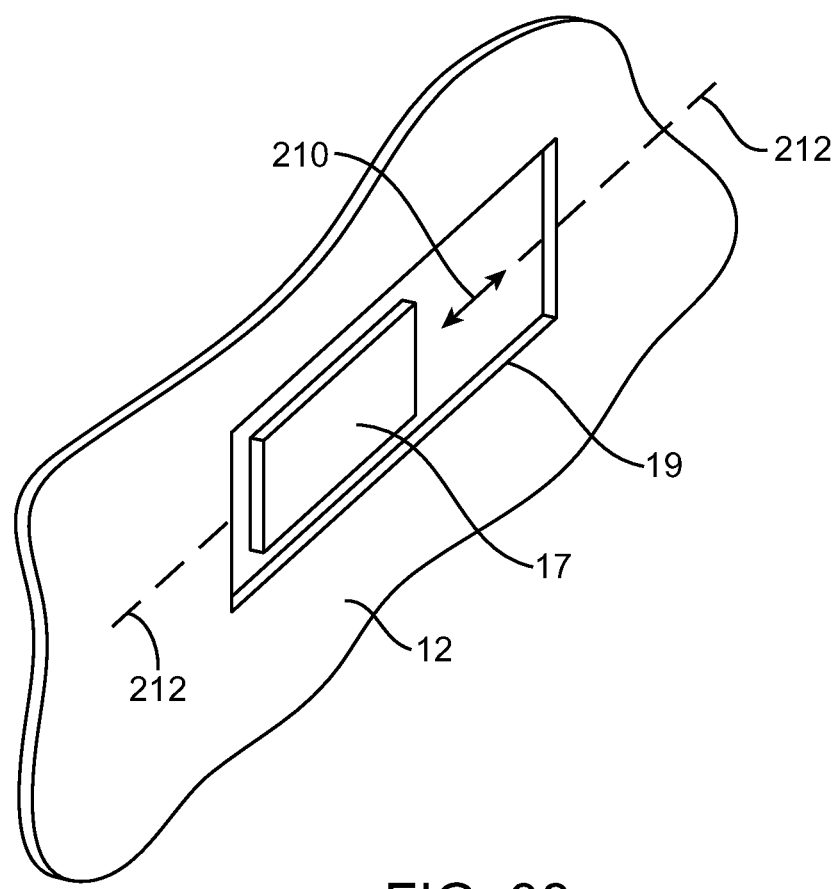
FIG. 38 is a side view of an illustrative portion of an electronic device housing containing a sliding switch in accordance with an embodiment of the present invention.

FIG. 38 is a perspective view of a portion of housing 12 of device 10 showing how switch member 17 of switch 16 may protrude through housing opening 19. In operation, switch 16 may slide in directions 210 along longitudinal axis 212. Member 17 may be placed at one end of opening 19 to open switch 16 and may be placed at the other end of opening 19 to close switch 16 (as an example).

Figure 39:
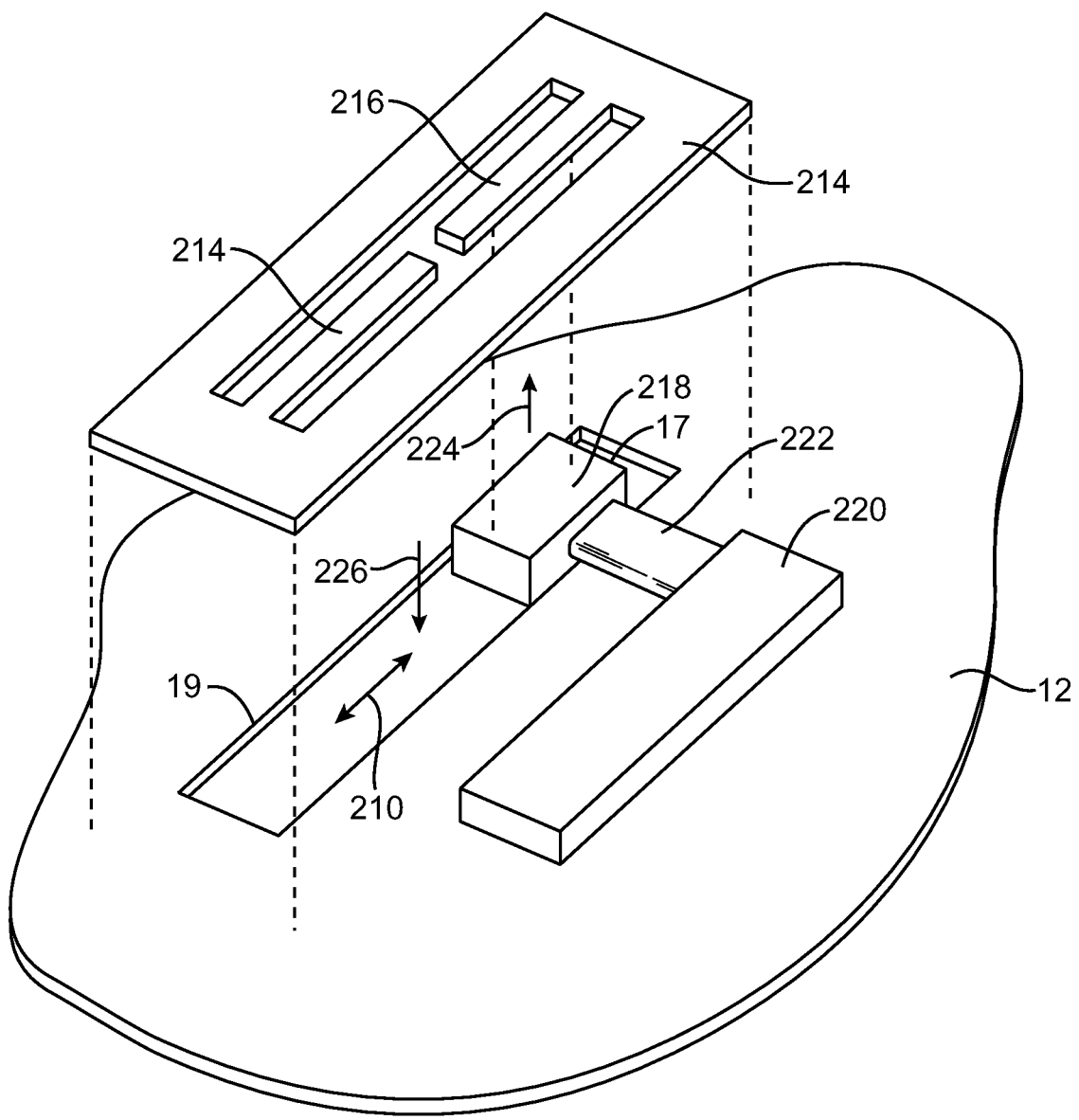
FIG. 39 is a perspective interior view of an electronic device with a sliding switch showing how a switch retention plate may be used to help hold the switch in place during use in accordance with an embodiment of the present invention.

An interior perspective view of switch 16 of FIG. 38 is shown in FIG. 39. As shown in FIG. 39, member 17 may be connected to switch mechanism 220 using coupling structure 222. Switching mechanism 220 may, if desired, be mounted to a rigid printed circuit board (e.g., a fiberglass-filled epoxy board) or a flexible printed circuit board (e.g., a flex circuit formed from a flexible polymer sheet such as a sheet of polyimide with conductive traces). The arrangement of FIG. 39 may be helpful in reducing device height (e.g., by avoiding the inclusion of potentially bulky components directly above switch member 17). Nevertheless, because arm 222 and switch mechanism 220 are laterally offset from opening 19, switch member 17 may be susceptible to slight inward movement in direction 224 when actuated by a user.

It may therefore be desirable to provide a support structure such as backing plate 214 to help switch member 17 to resist displacement in direction 224. When mounted to the interior of housing 12, flexible support members 216 of plate 214 may press against surface 218 of switch member 17, thereby biasing switch member 17 outwardly through opening 19 in direction 226. As switch member 17 moves back and forth in directions 210, flexible support members 216 may flex to accommodate different switch positions while continuously biasing switch member 17 in direction 226.

Figure 40:
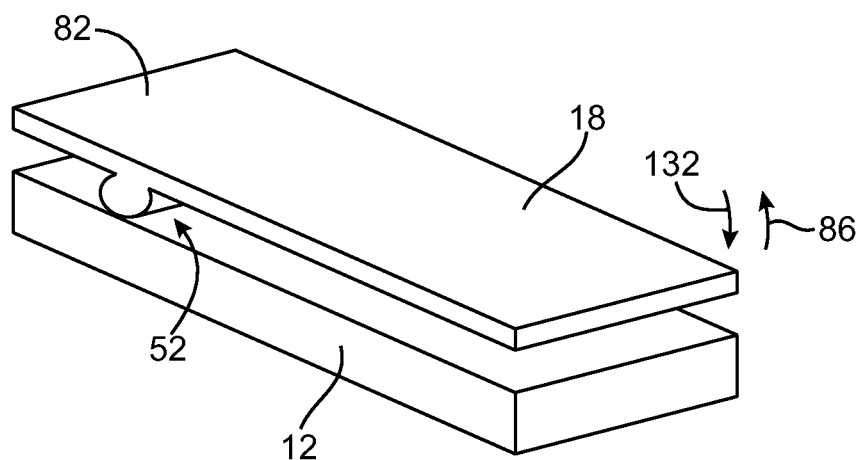
FIG. 40 is a perspective view of an illustrative electronic device showing how a clip may be mounted to the device at a hinge that contains a torsion spring in accordance with an embodiment of the present invention.

FIG. 40 is a perspective view of an illustrative electronic device 10 in which hinge 52 has been provided with a barrel shaped enclosure with an associated spring. A user may press on clip actuation structure 82 of clip 18 to open clip in direction 86. The spring in the barrel-shaped enclosure of hinge 52 may bias clip 18 in direction 132. The spring may be, for example, a single-ended torsion spring such as torsion spring 178 of FIG. 34 or a double-ended torsion spring such as spring 178 of FIG. 35. Torsion springs tend to be compact and therefore allow low-profile hinge structures to be formed. Low-profile designs may help improve the appearance of device 10 and may allow device 10 to be reduced in size. If desired, torsion springs may be used in devices 10 with clips 18 that are flush with housing surfaces.

Figure 41:
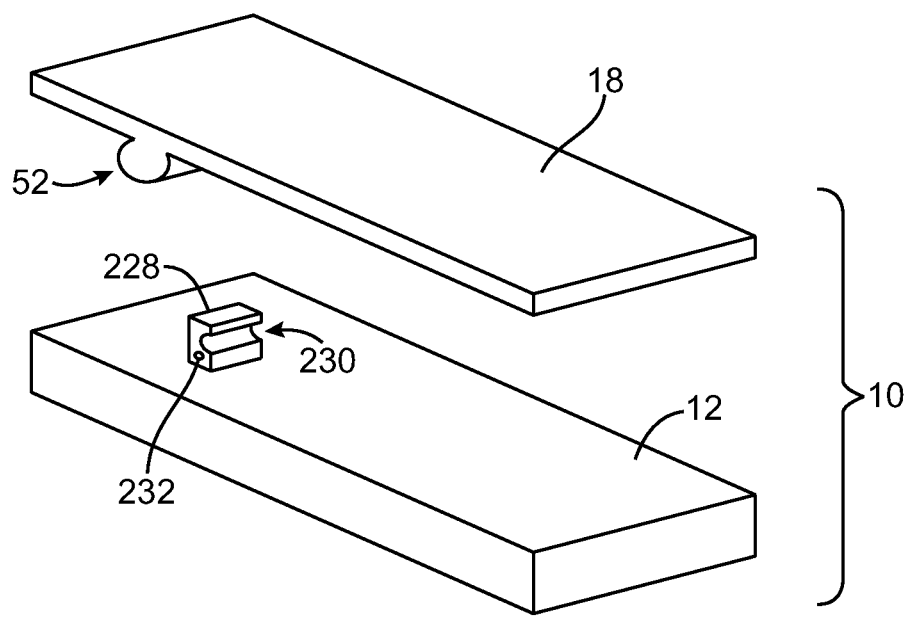
FIG. 41 is an exploded perspective view of the illustrative electronic device of FIG. 40.

An exploded perspective view of the illustrative device of FIG. 40 is shown in FIG. 41. As shown in FIG. 41, housing 12 may have a post such as post 228. Post 228 may have a cylindrical bore such as bore 232 for receiving hinge pin structures for hinge 52. The hinge pin structures may be used to pivotably attach clip 18 to housing 12.

Post 228 may have a groove such as groove 230 that serves to engage torsion spring 178. For example, groove 230 of post 232 may engage central portion 196 of double-ended torsion spring 178 of FIG. 35. Ends 198 of torsion spring 178 of FIG. 35 may be engaged by grooves inside end cap structures in hinge barrel 52 of clip 18. When held in this way, spring 178 may bias clip 18 into a closed position against housing 12.

Figure 42:
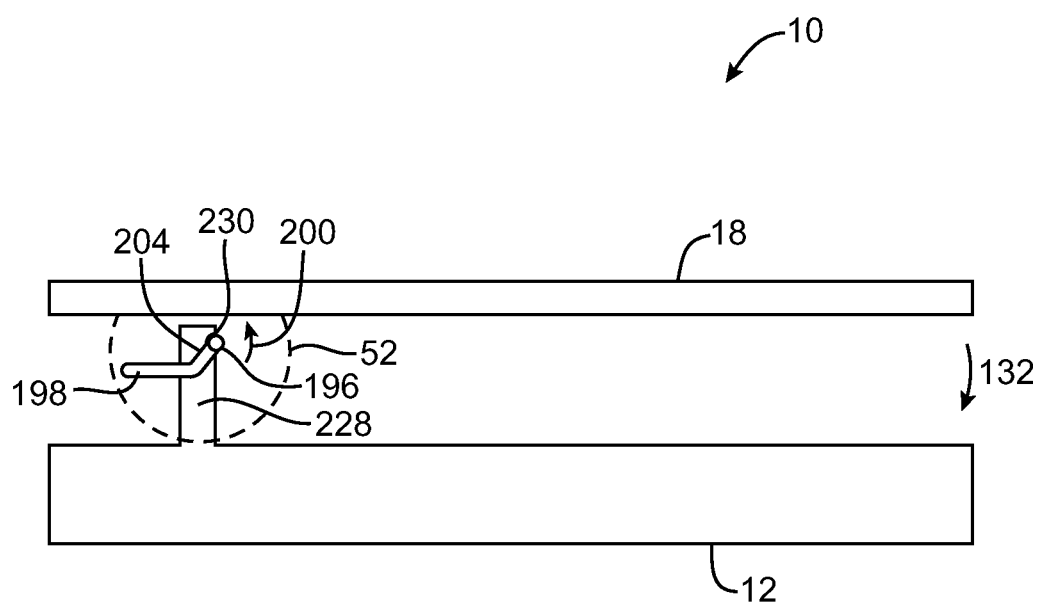
FIG. 42 is a side view of a device of the type shown in FIG. 41 showing how the tension spring may be used to hold the clip into place against the housing of the electronic device in accordance with an embodiment of the present invention.

A cross-sectional view of device 10 of FIGS. 40 and 41 is shown in FIG. 42. As shown in FIG. 42, portion 196 of spring 178 of FIG. 35 may be received in groove 230 of post 228 and may press upwards in direction 200. Ends 198 of spring 178 may press against portions of hinge structure 52 that are connected to clip 18. This biases clip 18 in direction 132 relative to housing 12.

Figure 43:
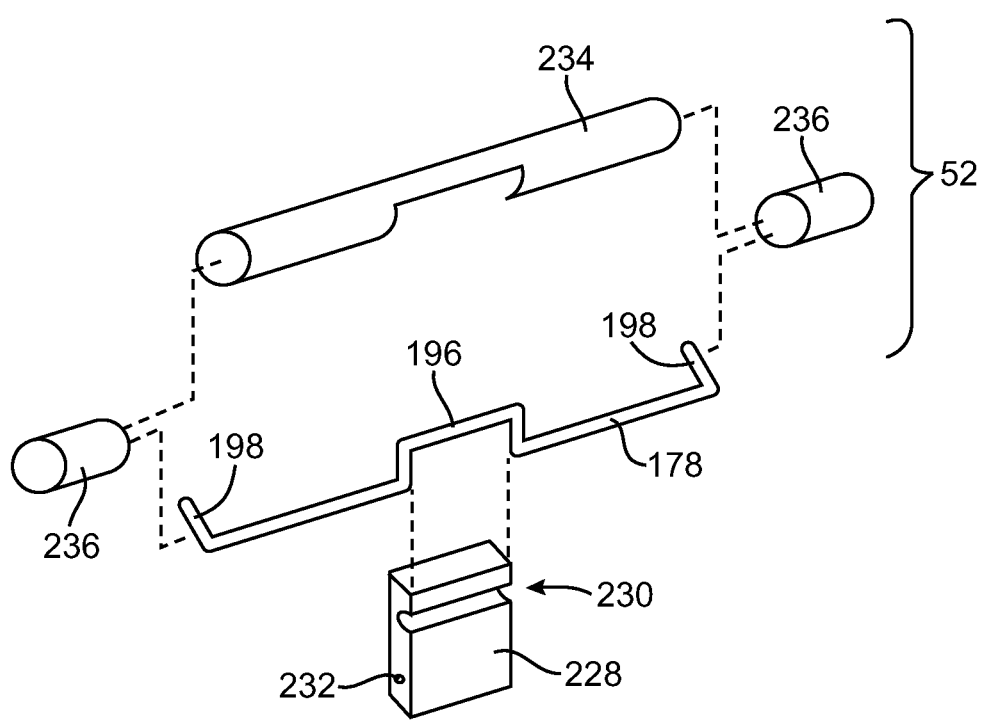
FIG. 43 is an exploded perspective view showing parts that may be used in an illustrative spring hinge for an electronic device clip based on a double-ended torsion spring in accordance with an embodiment of the present invention.

An exploded perspective view of illustrative components associated with hinge structure 52 of FIGS. 40, 41, and 42 is shown in FIG. 43. As shown in FIG. 43, hinge structure 52 may include a hinge barrel structure 234 in which spring 178 may be mounted. When assembled, spring portion 196 may fit in groove 230 of post 228. Spring edges 198 may be captured by grooves in barrel end caps 236. End caps 236 may be connected to barrel structure 234.

Figure 44:
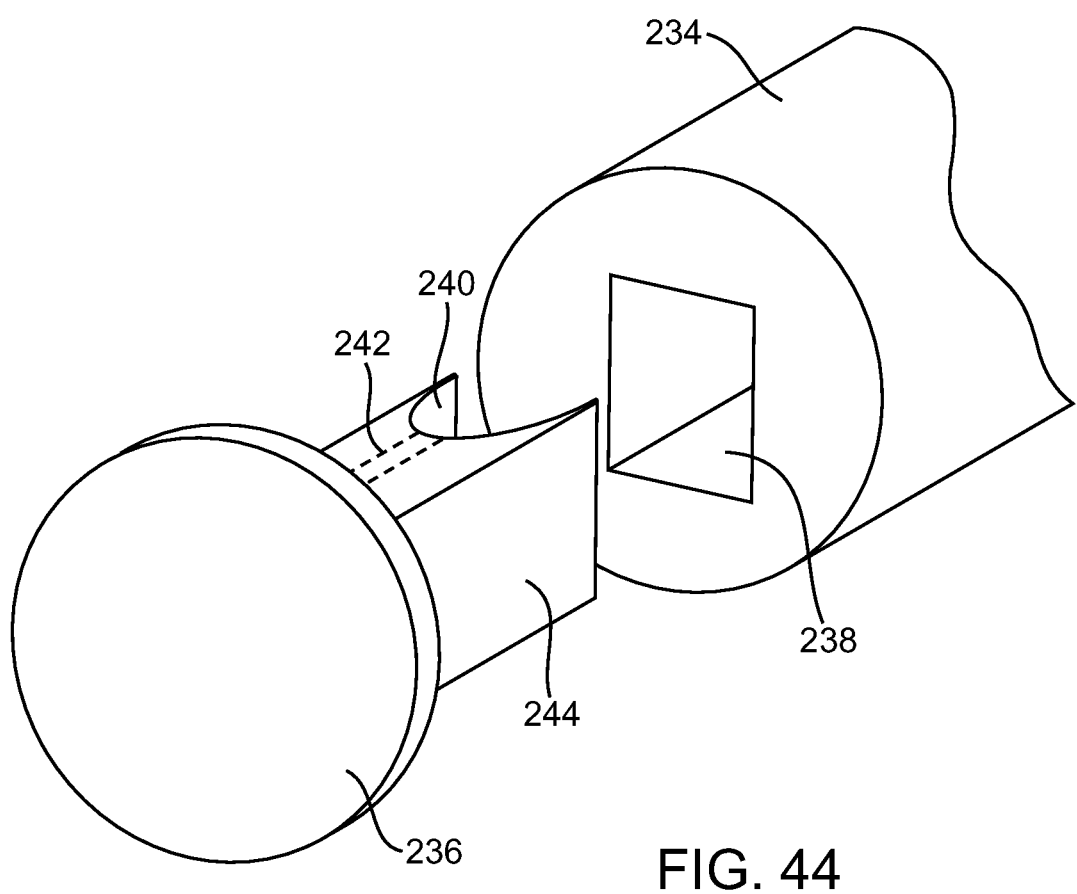
FIG. 44 is an exploded perspective view showing how hinge caps may be inserted into a hinge barrel in a hinge for an electronic device clip in accordance with an embodiment of the present invention.

A perspective view of an illustrative barrel end cap and an associated end of barrel structure 234 is shown in FIG. 44. As shown in FIG. 44, barrel structure 234 may have an opening such as rectangular opening 238 to receive protruding end cap portion 244 on end cap 236. Portion 244 may be press fit into opening 238 during assembly. As end cap 236 is mounted to barrel 234, spring 178 is guided along guide surface 240 and into buried spring capture groove 242. While being guided in this way, end 198 of spring 178 is twisted about hinge rotational axis 192 (FIG. 35) with respect to spring portion 196, thereby pre-torsioning spring 178.

Figure 45:
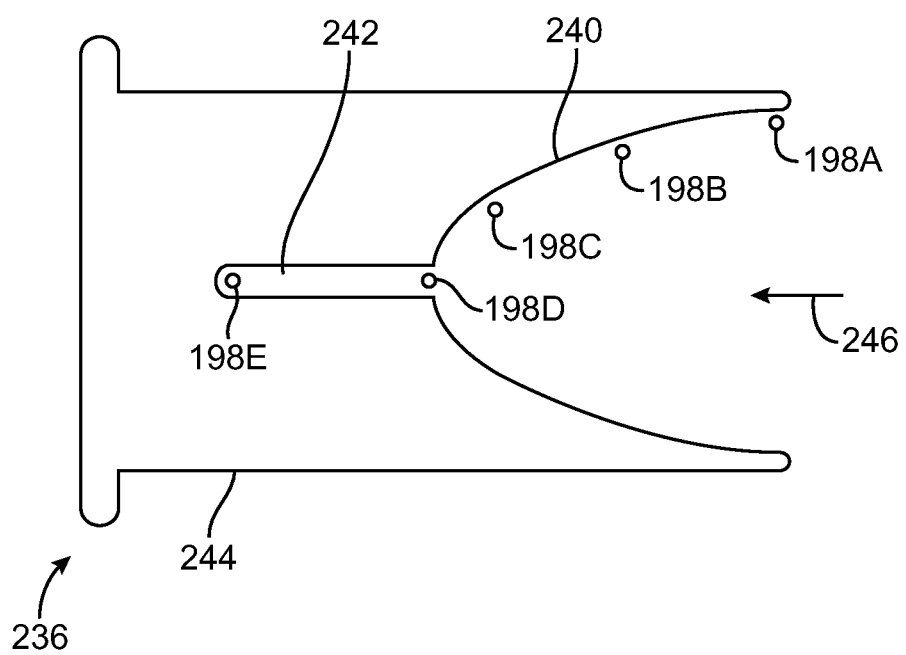
FIG. 45 is a cross-sectional top view of an illustrative hinge barrel cap showing how the cap may contain guiding surfaces that help pre-bias a torsion spring in accordance with an embodiment of the present invention.

This pre-biasing process is illustrated in the cross-sectional top view of FIG. 45. As shown in FIG. 45, spring end 198 is initially in position 198A. As spring end 198 is forced in direction 246 (i.e., as end cap 236 is attached to barrel 234), spring end 198 is guided along surface 240 to position 198B. During this guiding process, spring end 198 is twisted with respect to spring portion 196, because spring portion 196 is captured by post groove 230 (FIG. 43). Further assembly operations guide spring end 198 to position 198C, 198D, and 198E. In position 198D, spring end 198 starts to be guided by groove 242. In position 198E, assembly is complete and the twisted (pre-biased) spring 178 is held in place within hinge structures 52.

Figure 46:
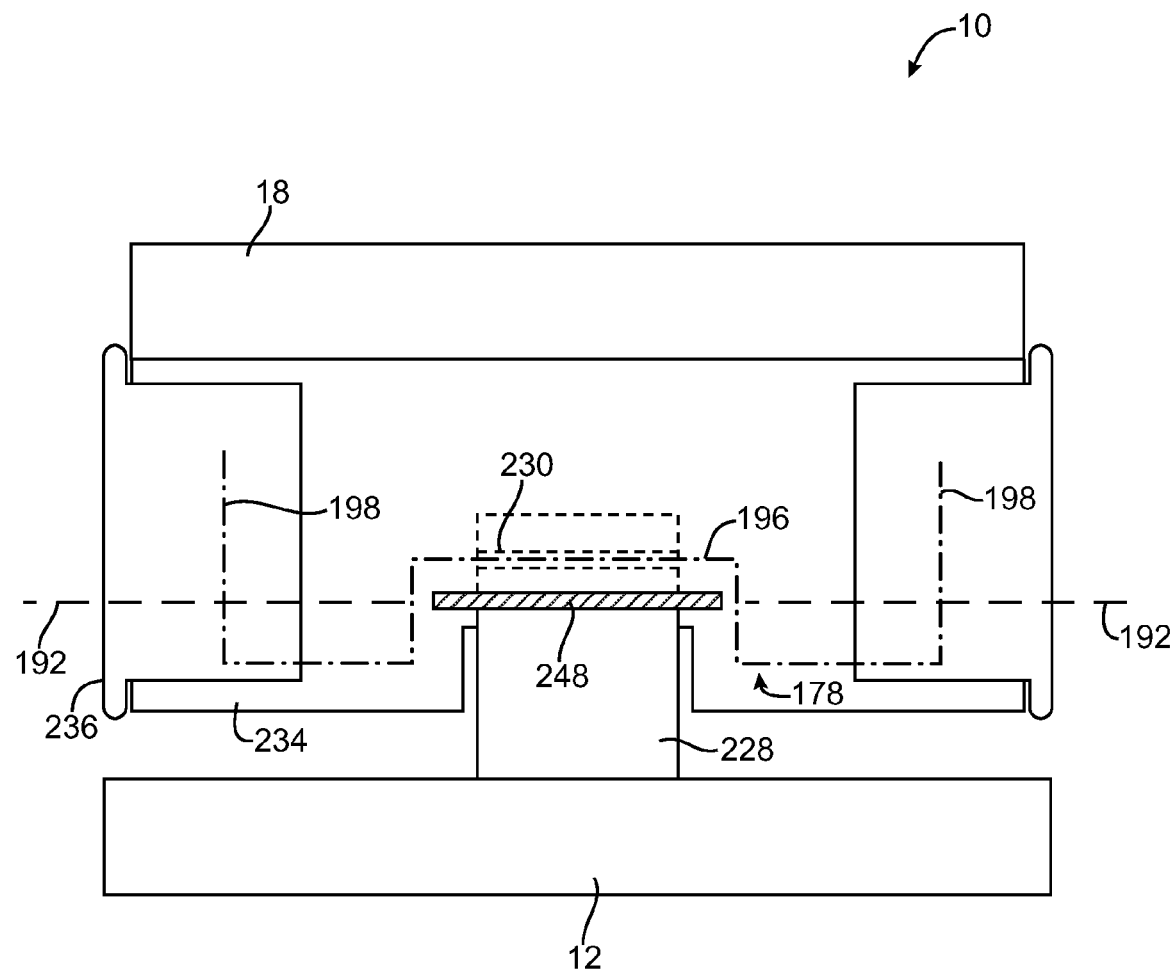
FIG. 46 is a cross-sectional end view of illustrative structures that may be used in the hinge of an electronic device clip with a double-ended torsion spring in accordance with an embodiment of the present invention.

A cross-sectional end view of device 10 that shows how end caps 236 may be mounted to hinge barrel structure 234 is shown in FIG. 46. As shown in FIG. 46, hinge structure 234 may be attached to clip 18. Post 228 may be connected to device housing 12. Pin 248 may pass through pin hole 232 (FIG. 43) and into corresponding openings in barrel 234. In operation, clip 18 pivots about pin axis 192, which serves as the rotational axis for hinge 52. Spring portion 196 is captured by groove 230 in post 228, thereby indirectly pushing against housing 12. Spring ends 198 are captured in end caps 236 and thereby push against clip 18.

Figure 47:
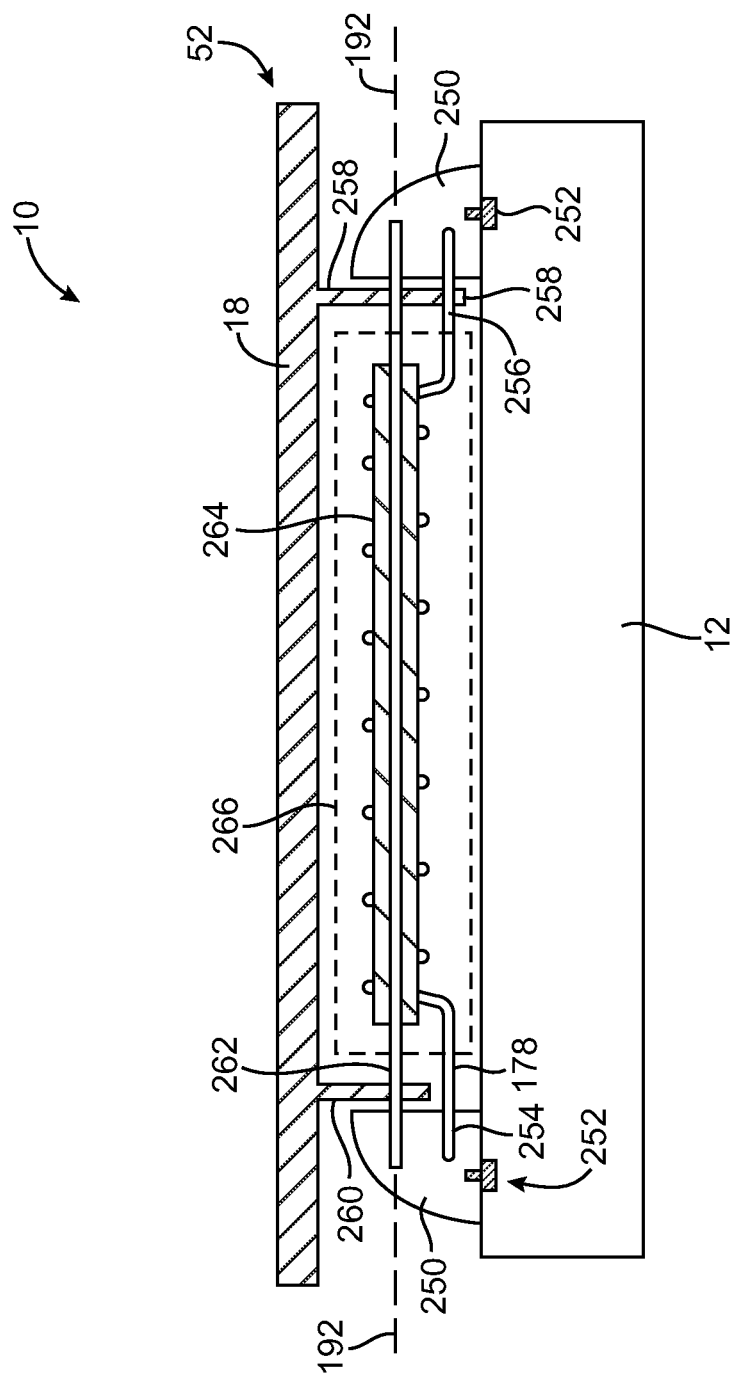
FIG. 47 is a cross-sectional end view of illustrative structures that may be used in the hinge of an electronic device clip with a coil spring in accordance with an embodiment of the present invention.

An illustrative arrangement in which clip biasing spring 178 is implemented using a coil spring configuration is shown in FIG. 47. As shown in FIG. 47, housing 12 may have hinge mounting structures 250. Mounting structures 250 may be attached to housing 12 using screws 252 or other suitable fastening mechanisms. Clip 18 has hinge members 260 and 258. Pin 262 passes through holes in members 260 and 258 and is received in holes in mounting structures 250. During operation, clip 18 may pivot around pin 262 (e.g., about pivot axis 192). Spring 178 may have a coiled center section that is wrapped around pin 262. Bushing 264, which may be formed from plastic or other suitable materials, may prevent spring 178 from becoming too tightly wrapped around pin 262 and may help to reduce friction in hinge 52. An optional cosmetic cover 266 may be used to hide the coils of spring 178 from view. End 254 of spring 178 may be attached to mounting structure 250 and end 256 of spring 178 may be attached to clip member 258. During assembly, spring 178 may be pre-biased. When released, ends 256 and 254 push in opposite directions, thereby biasing clip 18 towards its closed position against housing 12.

Figure 48:
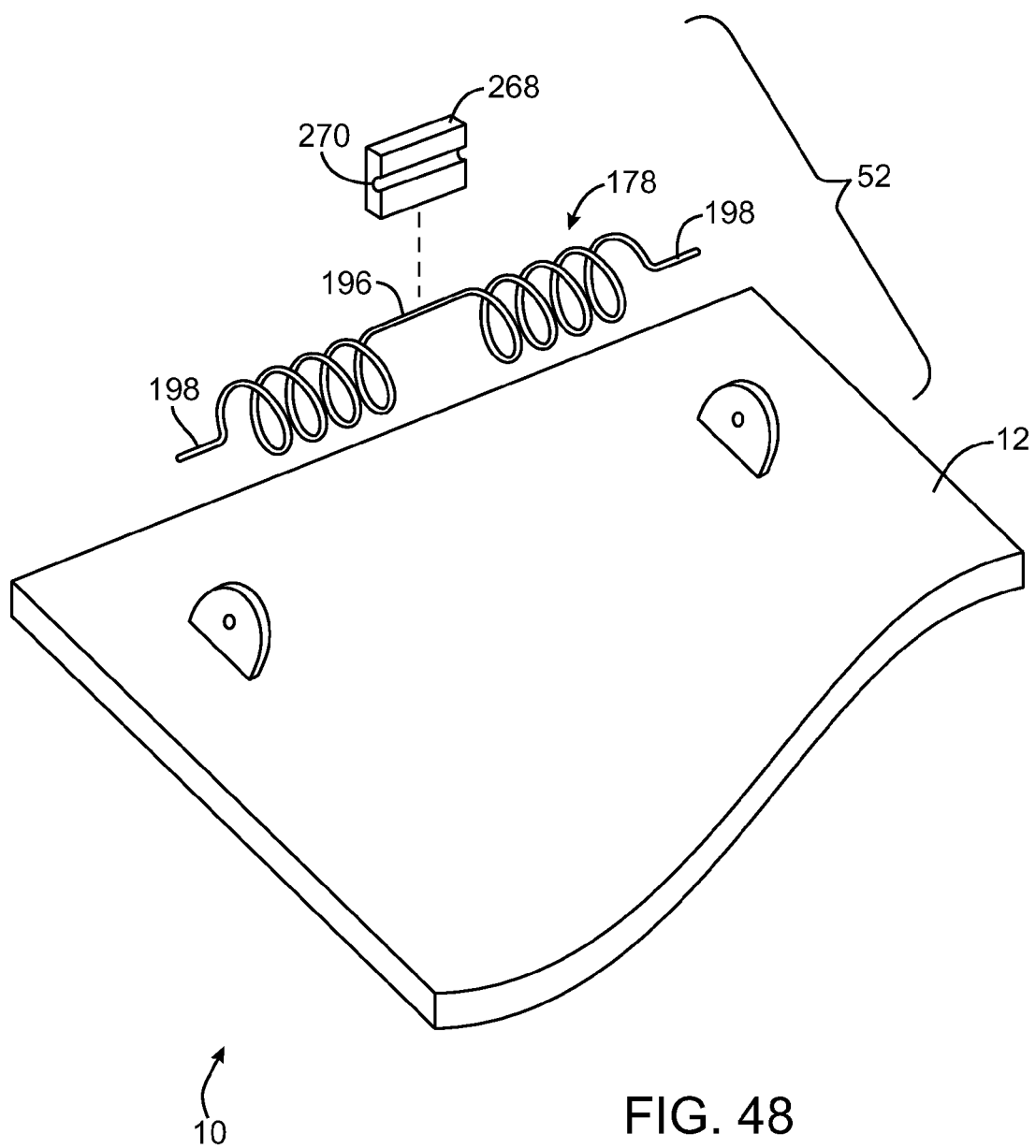
FIG. 48 is an exploded perspective view showing how an electronic device clip hinge may provide the clip in an electronic device with a bias using a coil spring with a central bar in accordance with an embodiment of the present invention.
Figure 49:
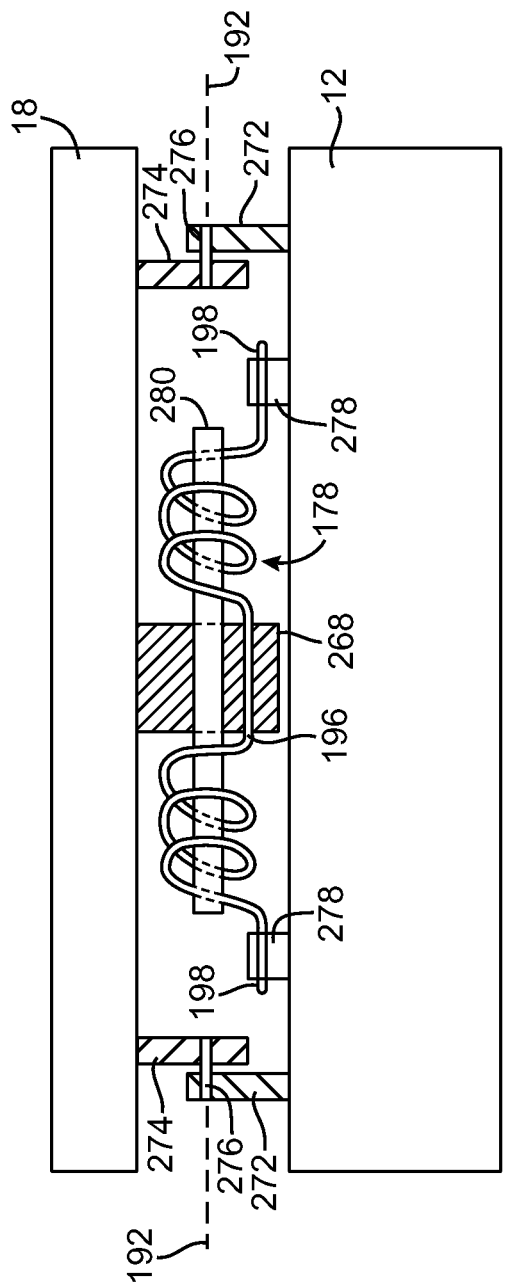
FIG. 49 is a cross-sectional end view of an illustrative hinge with a coil spring of the type shown in FIG. 48 for biasing a clip on an electronic device in accordance with an embodiment of the present invention.

If desired, spring 178 may be implemented using a coil spring with a straight central portion such as portion 196 of the double-ended torsion spring of FIG. 35. This type of arrangement is shown in FIGS. 48 and 49. FIG. 48 is an exploded perspective view of device 10 showing how hinge 52 may be provided with a double-ended coil spring having a central portion 196 that is received by groove 270 of clip post structure 268. FIG. 48 also shows how spring 178 may have coils interposed between central portion 196 and respective ends 198.

As shown in FIG. 49, clip 18 may have hinge members 274 and housing 12 may have hinge members 272. Pins 276 may be used to join members 272 and 274 and thereby join clip 18 and housing 12 for pivoting motion about pivot axis 192. Posts 278 may be attached to housing 12 and post 268 may be attached to clip 18. Spring support member 280 may pass through the centers of the coils of spring 178. Ends 198 of spring 178 may engage posts 278 and housing 12. Portion 196 of spring 178 may engage post 268 and clip 18. By pre-biasing spring 178, clip 18 may be biased towards its closed position.

Figure 50:
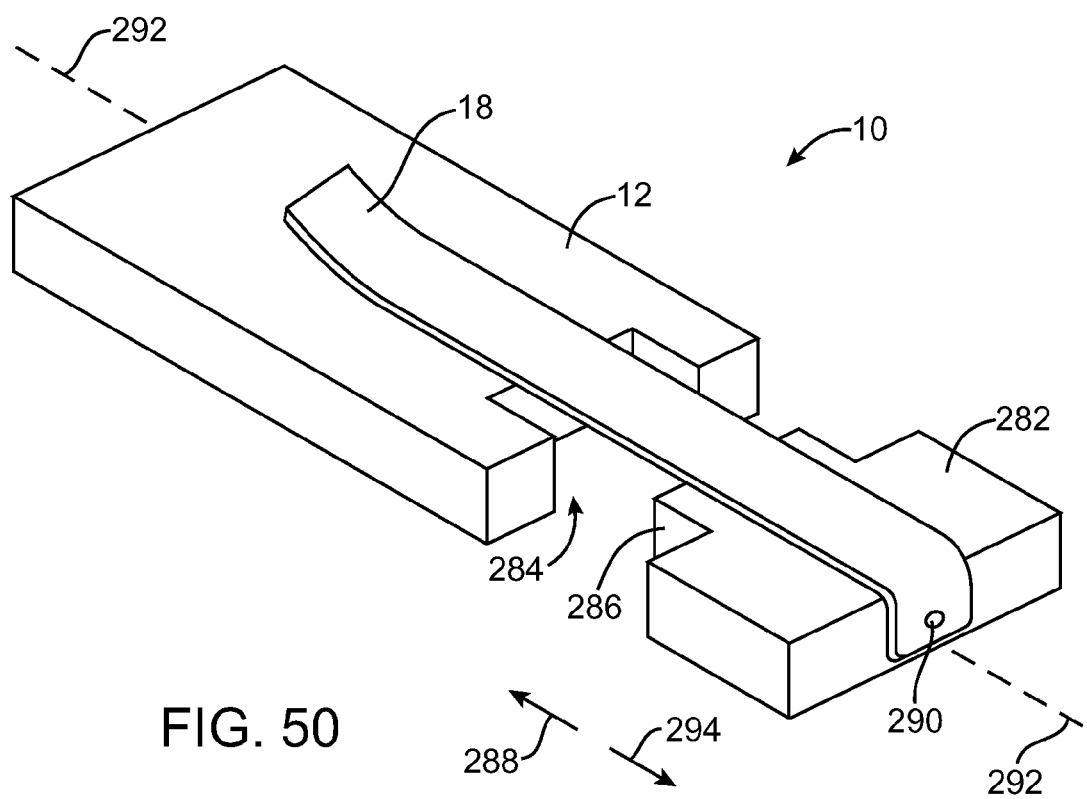
FIG. 50 is a perspective view of an illustrative electronic device having a removable clip in accordance with an embodiment of the present invention.

If desired, clip 18 may be mounted to a removable coupling structure (i.e., coupling structure 20 of FIG. 2). This type of arrangement is shown in FIG. 50. As shown in FIG. 50, device 10 may have a removable structure such as removable structure 282. Structure 282 may have a protruding portion such as portion 286 that mates with a corresponding recessed portion in housing 12 such as recessed portion 284. If desired, other mating structures may be used to removably engage structure 282 and housing 12.

Clip 18, which may be formed from a flexible strip of metal, may be mounted to removable structure 282 (e.g., using a screw such as screw 290). When it is desired to attach mounting structure 282 and clip 18 to housing 12 of device 10, structure 282 and clip 18 may be inserted into housing 12 by moving structure 282 in direction 288 along longitudinal device axis 292. When inserted into opening 284, structure 282 may be held in place by friction or by using an attachment mechanism such as a spring-loaded pin mechanism with mating detents. To remove clip 18 from device 10 when clip 18 is not needed, structure 282 may be moved in direction 294 along axis 292.

Figure 51:
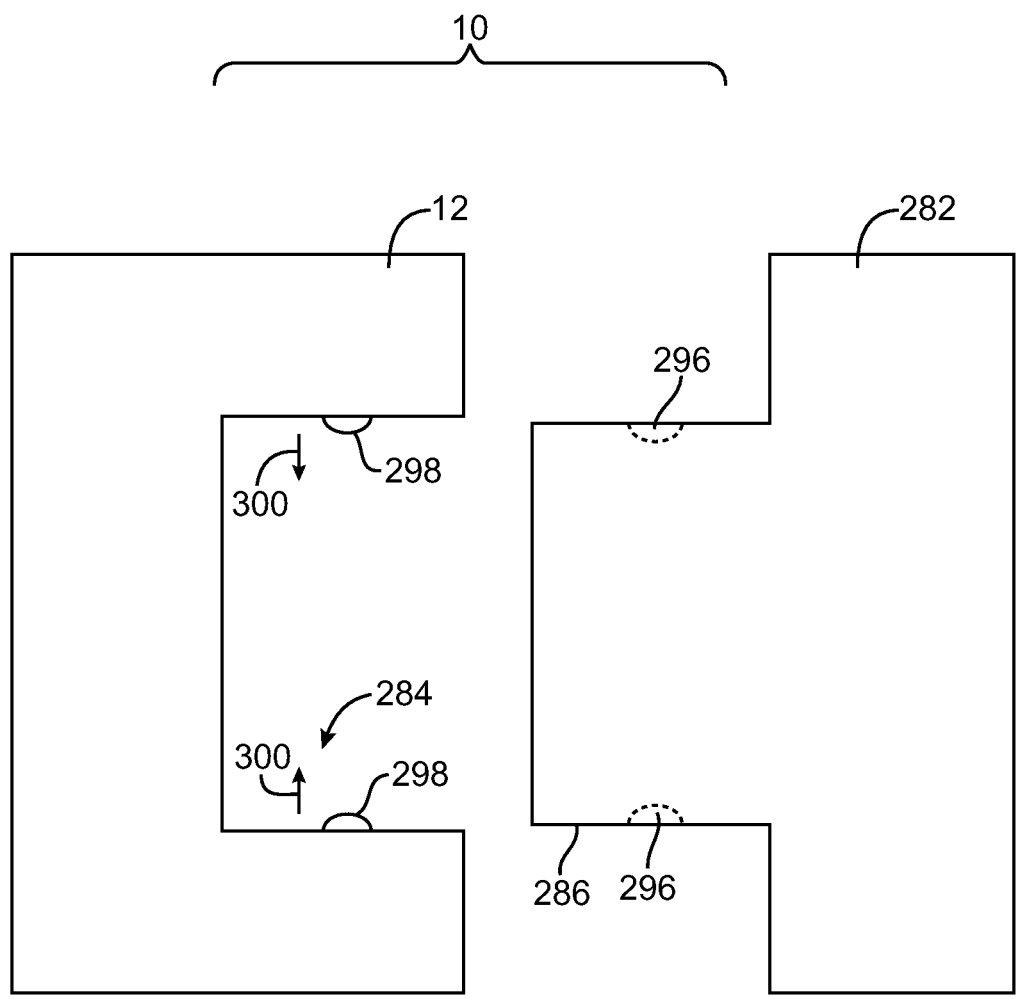
FIG. 51 is a top view of a portion of the removable clip and electronic device of FIG. 50 in accordance with an embodiment of the present invention.

As shown in FIG. 51, structure 282 may be held in place in opening 284 using spring-loaded pins 298. Portion 286 of structure 282 may have recessed detents 296 that receive the protruding ends of spring-loaded pins 298 when structure 282 is inserted into opening 284. During the insertion process, pins 298 may be forced flush with the exposed inner surfaces of opening 284. Once structure 282 has been inserted completely, however, pins 298 will protrude into recesses 296 on structure 282, thereby holding structure 282 in place against housing 12.

Figure 52:
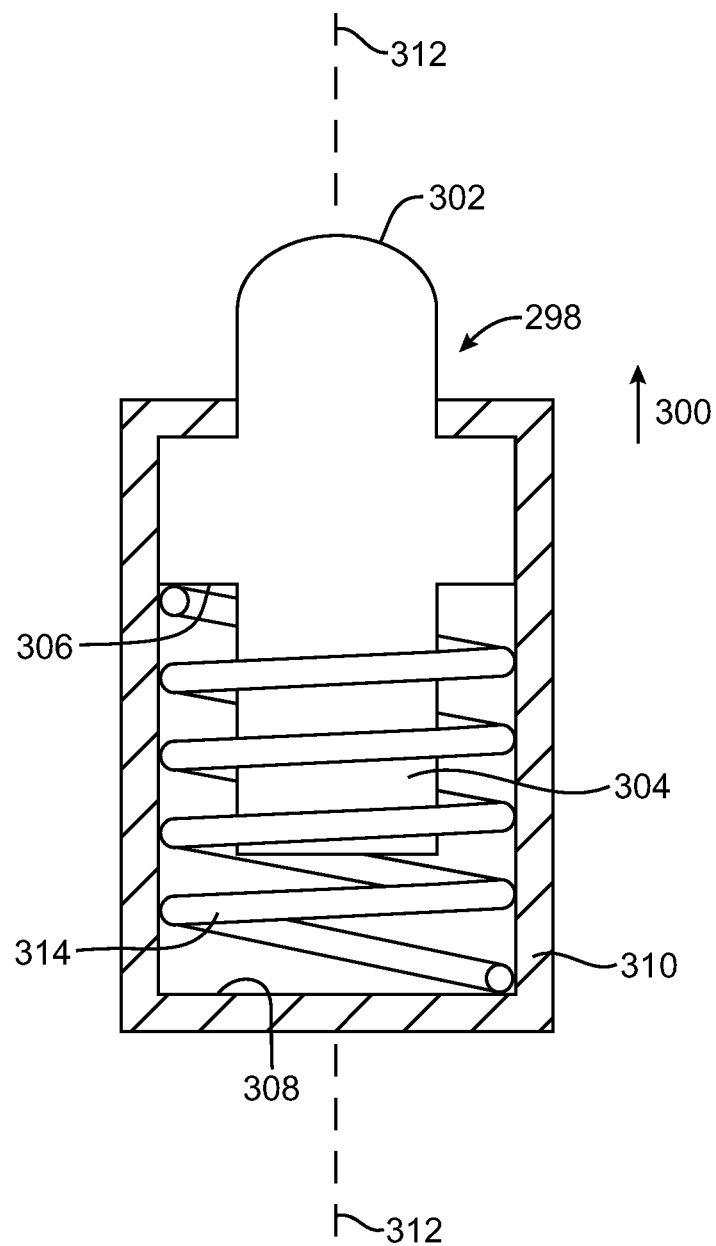
FIG. 52 is a cross-sectional view of an illustrative spring-loaded pin of the type that may be used in removably attaching a clip to an electronic device in accordance with an embodiment of the present invention.

A cross-sectional diagram of an illustrative spring-loaded pin of the type that may be used for pins 298 of FIG. 51 is shown in FIG. 52. As shown in FIG. 52, pin 298 may have a tip 302 that mates with a corresponding detent such as one of detents 296 of FIG. 51. Pin member 304 may reciprocate along longitudinal axis 312 within barrel member 310. Spring 314 may press against barrel surface 308 and against pin surface 306, thereby forcing pin 298 upwards in direction 300.

Figure 53:
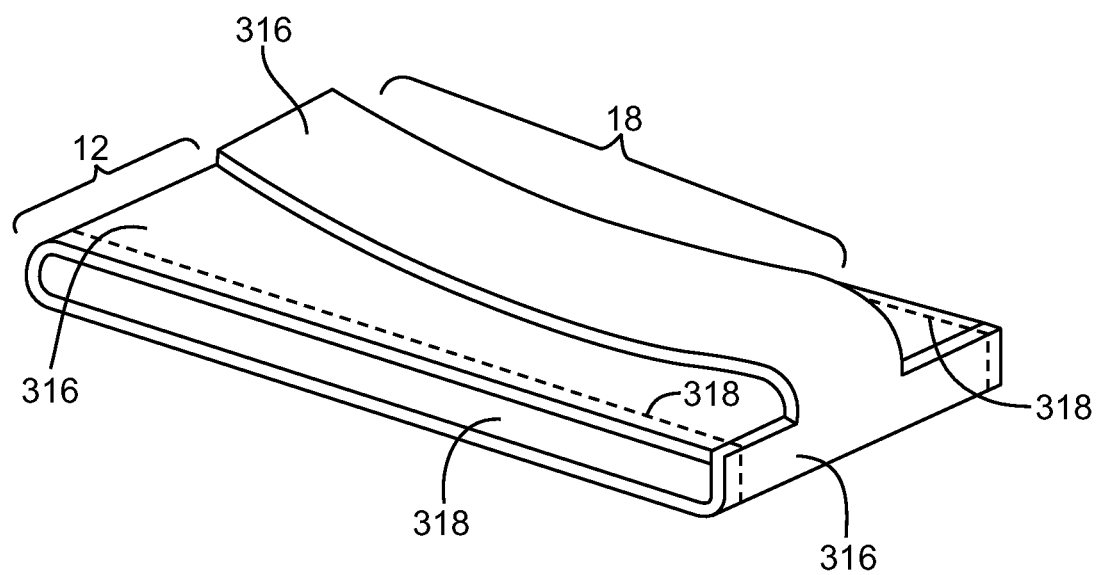
FIG. 53 is a perspective view of an illustrative electronic device having a housing and integral clip that have been formed from a unitary piece of bent metal in accordance with an embodiment of the present invention.

If desired, electronic device 10 may have a housing and clip that are formed from a shared structure. As shown in FIG. 53, for example, electronic device 10 may have a housing 12 and a clip 18 that are formed from a common piece of bent sheet metal such as metal sheet 316. If desired, other materials may be used in forming a common structure for clip 18 and housing portions 12. For example, a single piece of plastic may be used in forming both clip 18 and portions of housing 12.

With the illustrative configuration of FIG. 53, member 316 is formed from a bent piece of metal. The main body of housing 12 is formed from two overlapping planer rectangular sections with rounded end faces. Clip 18 is formed by a narrow extension to the main housing portion. If desired, clip 18 may be formed from a larger piece of metal (e.g., a strip of metal that is equal in width to the strip of metal that is used in forming housing 12.

When forming device 10 using the bent metal housing arrangement of FIG. 53, side panels 318 (also sometimes referred to as end caps) may be used to fill the otherwise open portions of housing 12. End caps 318 may be formed from plastic, epoxy, or any other suitable material.

Figure 54:
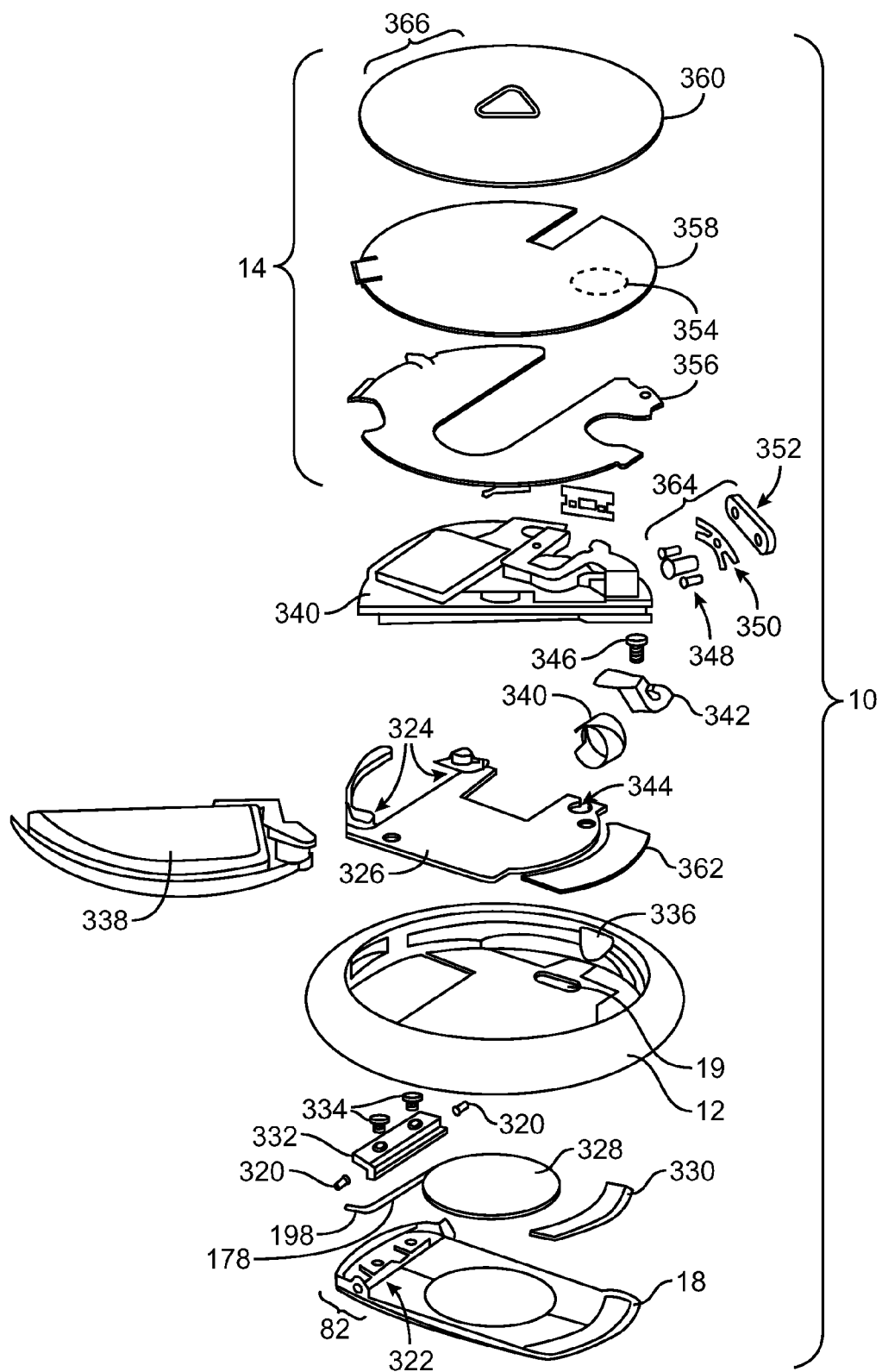
FIG. 54 is an exploded perspective view of an illustrative electronic device with a clip and switch in accordance with an embodiment of the present invention.

An exploded perspective view of an illustrative embodiment of portable electronic device 10 is shown in FIG. 54. As shown in FIG. 54, device 10 may have a housing 12 with a circular outline and rounded edges. Clip 18 may be formed from a curved piece of metal that lies flush with the rear surface of housing 12 when in its closed position. Biasing may be provided for clip 18 using single-ended torsion spring 178 (see, e.g., FIG. 34). Spring 178 may be held in place on clip 18 using spring cap 332. Spring cap 332 may be formed from plastic or metal and may be connected to clip 18 using screws 334 or other suitable fastening mechanisms. Rubber pads 328 and 330 may help to improve friction between clip 18 and objects that are being grasped by clip 18 (e.g., cloths). Pads 328 and 330 may be attached to clip 18 using adhesive (as an example).

Hinge pins 320 may be used to form hinge 52 (FIG. 40). Pins 320 may be mounted in hinge pin holes 324 on hinge plate 326. Hinge plate 326 may be attached to housing 12 using welds or other suitable attachment mechanisms. Cover plate 362 may be mounted adjacent to hinge plate 326. Opening 19 in the rear face of housing 12 may be used to accommodate switch member 17 (see, e.g., FIGS. 38 and 39). Opening 336 may accommodate audio jack 34. Metal ring 340 may be welded to housing 12 to form a sleeve for the audio jack.

Battery 338 may be used in powering device 10. Printed circuit board 340 may receive power from battery 338. Printed circuit board 340 may be used to mount electrical components such as integrated circuits (storage and processing circuitry 30 of FIG. 3).

Button 14 may be formed from structures such as glass button member 360, sensor flex circuit 358 (e.g., an array of one or more capacitive touch sensor electrodes that provide button 12 with touch sensor functionality) and plate 356. An elastomeric gasket may be interposed between the edges of glass button member 360 and housing 12 to prevent damage to member 360. Dome switch 354 may be mounted on the underside of sensor flex circuit 358 and may be actuated by depressing button 14. Flex circuit 358 may be attached to member 360 with adhesive. Flexible metal bracket 356 may be attached to flex circuit 358 with adhesive. The perimeter of flexible metal bracket 356 may be captured by an annular groove in housing 12 that allows for a limited range of vertical travel for button 12.

Button 364 may include a button member such as button member 352. Spring 350 may bias button member 352 outward. Screws 348 may be used in attaching button member 352 to device 10.

Button 14 may have an automatic lockout feature that prevents inadvertent actuation of button 14 when a user is actuating clip 18, but does not wish to use button 14. The button lockout feature may be automatically activated when a user's finger is detected in region 366 of button member 360 using touch sensor flex 358. When sensor flex 358 detects that a user is squeezing device 10 between the user's fingers by pressing on clip actuation structure 82 of clip 18 and corresponding region 366 on the top surface of button member 360, actuator 342 may prevent vertical travel of button 14. Actuator 342 may be attached to plate 326 using screw 346. Threaded boss 344 on plate 326 may receive screw 346.

Figure 55:
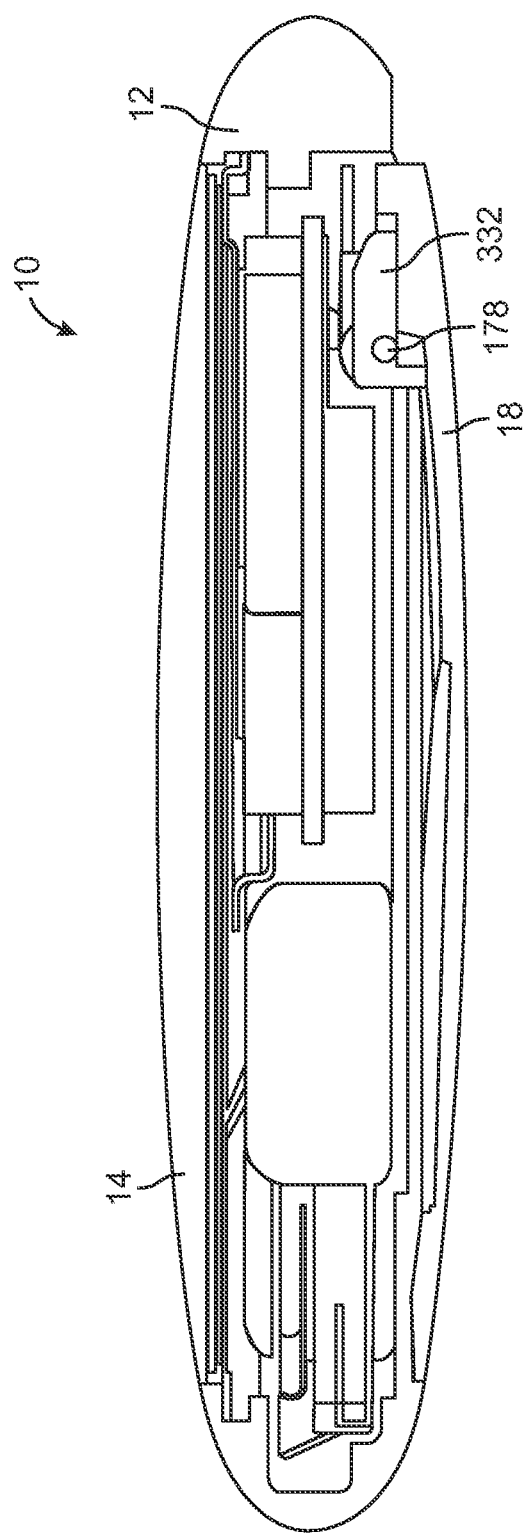
FIG. 55 is a cross-sectional view of an electronic device of the type shown in FIG. 54 in accordance with an embodiment of the present invention.

A cross-sectional side view of device 10 of FIG. 54 is shown in FIG. 55.

Although device 10 has been illustrated as having a clip such as clip 18, the use of clip 18 is optional. Moreover, other device features such as the use of switch 16 and button 14 are optional. The particular illustrative combinations of device features that are shown in the drawings are also merely provided as examples. If desired, other combinations of these features may be used.

For example, clip 18 may, in general, be provided with any suitable biasing arrangement (e.g., a torsion spring, a coil spring, a ribbon spring, an integral clip-biasing structure such as a twisted metal loop, etc.). Any of these clip configurations may be used with any of the illustrative housings described herein (e.g., a rectangular housing, a circular housing, housings with surfaces that lie flush with clips, combinations of these clip configurations, etc.). Moreover, any suitable coupling mechanism may be used in attaching clip 18 to housing 12 (e.g., a removable clip mounting structure, a flexible clip mounting structure, a fixed clip mounting structure, a rotatable clip mounting structure such as a ratcheting clip mounting structure, a clip mounting structure with a spring force adjustment, combinations of these mounting structures, etc.).

The foregoing is merely illustrative of the principles of this invention and various modifications can be made by those skilled in the art without departing from the scope and spirit of the invention.

What is claimed is:

1. A portable electronic device, comprising:
a housing having a housing surface;
a clip; and
a hinge coupled between the housing and the clip that includes a linkage member with multiple pivot points and allows the clip to pivot between an open position in which at least part of the clip is offset from the housing and a closed position in which the clip lies flush with the housing surface wherein the linkage member includes at least:
a first bar pivotally connected to the clip and the housing; and
a second bar pivotally connected to the clip and the housing, the second bar longer than the first bar; wherein the first and second bars angularly pivot the clip with respect to the housing when the clip is pivoted between the closed position and the open position.

2. The portable electronic device defined in claim 1 wherein the hinge pivots about a pivot axis, the portable electronic device further comprising a rotatable coupling mechanism coupled between the housing and the hinge that allows the clip to rotate relative to the housing about a rotational axis that is different than the pivot axis.

3. The portable electronic device defined in claim 2 wherein the rotatable coupling mechanism comprises ratcheting structures.

4. The portable electronic device defined in claim 3 wherein the ratcheting structures comprise a ring with corrugations and a spring-loaded pin that bears against the corrugations.

5. The portable electronic device defined in claim 4 wherein the hinge is mounted to the ring.

6. The portable electronic device defined in claim 1 wherein the hinge comprises a torsion spring that biases the clip against the housing.

7. The portable electronic device defined in claim 6 wherein the clip comprises a curved surface, wherein the housing surface with which the clip lies flush is also curved, and wherein the housing has a circular outline.

8. The portable electronic device defined in claim 2 wherein the portable electronic device comprises a media player and wherein the housing has a circular outline that surrounds the rotational axis.

9. The portable electronic device defined in claim 1 further comprising
a switch member that protrudes through an opening in the housing; and
a backing plate that has at least one flexible member that bears against the switch member and biases the switch member outwardly through the opening.

10. The portable electronic device defined in claim 1 further comprising a button that includes a button member and a touch sensor array connected to a surface of the button member.

11. A portable electronic device, comprising:
a housing;
storage and processing circuitry mounted in the housing;
an input device that includes a touch sensor mounted to a front face of the housing;
a clip; and
hinge structures that connect the clip to a rear surface of the housing, that include a linkage member with multiple pivot points, and that bias the clip towards a closed position, the linkage member including at least a first bar pivotally connected to the clip and the housing and a second bar pivotally connected to the clip and the housing, the second bar longer than the first bar; wherein the first and second bars angularly pivot the clip with respect to the housing when the clip is pivoted between the closed position and the open position; and the clip lies flush with the rear surface of the housing in the closed position.

12. The portable electronic device defined in claim 11 wherein the hinge structures include a torsion spring.

13. The portable electronic device defined in claim 12 wherein the torsion spring has an elongated central portion that engages a groove on a post.

14. The portable electronic device defined in claim 12 wherein the hinge structures further comprises a hinge barrel and end caps that fit into the barrel.

15. The portable electronic device defined in claim 14 wherein the end caps have grooves that receive ends of the torsion spring and that have guide surfaces that pre-bias the spring.

16. The portable electronic device defined in claim 11 wherein the hinge structures include a coil spring.

17. The portable electronic device defined in claim 16 wherein the coil spring includes a first end that presses against the clip and a second end that presses against the housing.

18. The portable electronic device defined in claim 17 further comprising a bushing that is surrounded by coils in the coil spring.

19. The portable electronic device defined in claim 11 wherein the hinge structures form a four-bar linkage in which the housing serves as a first bar, the clip serves as a second bar, a first hinge member serves as a third bar, and a second hinge member serves as a fourth bar, and wherein the hinge structures comprise pins that pivotably couple the first and second hinge members between the housing and the clip.

20. The portable electronic device defined in claim 11 wherein the hinge structures comprise a screw that adjusts how much the hinge structures bias the clip towards the closed position.

21. The portable electronic device defined in claim 11 further comprising a flexible member to which the hinge structures are mounted to allow the hinge structures to move relative to the housing when the flexible member flexes.

22. A portable electronic device having:

a housing;

a clip;

a hinge with which the clip is attached to the housing that includes a linkage member with multiple pivot points wherein the linkage member includes at least:

a first bar pivotally connected to the clip and the housing; and a second bar pivotally connected to the clip and the housing, the second bar longer than the first bar; and a torsion spring in the hinge that biases the clip towards the closed position;

wherein the clip lies flush with a surface of the housing in the closed position; and the first and second bars angularly pivot the clip with respect to the housing when the clip is pivoted between the closed position and the open position.

23. The portable electronic device defined in claim 22 wherein the hinge has a pivot axis about which the hinge and clip pivot and wherein the portable electronic device further comprises a rotatable coupling structure that allows the hinge and clip to rotate about a rotational axis that is perpendicular to the pivot axis.

24. The portable electronic device defined in claim 22 further comprising a glass button member with a touch sensor array.

* * * * *